United States Patent
Chien et al.

(10) Patent No.: US 7,968,367 B2
(45) Date of Patent: Jun. 28, 2011

(54) FABRICATING METHOD OF THIN FILM TRANSISTOR ARRAY SUBSTRATE

(75) Inventors: Yao-Hong Chien, Taoyuan County (TW); Chih-Chieh Wang, Taipei County (TW); Xuan-Yu Liu, Hualien County (TW); Li-Shan Chen, Taipei County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 12/854,914

(22) Filed: Aug. 12, 2010

(65) Prior Publication Data

US 2010/0304525 A1    Dec. 2, 2010

Related U.S. Application Data

(62) Division of application No. 12/396,492, filed on Mar. 3, 2009, now Pat. No. 7,812,352.

(30) Foreign Application Priority Data

Jul. 1, 2008  (TW) .............................. 97124764 A

(51) Int. Cl.
*H01L 21/00* (2006.01)
*H01L 21/84* (2006.01)
*H01L 21/8238* (2006.01)

(52) U.S. Cl. ........... 438/72; 438/149; 438/153; 438/199

(58) Field of Classification Search .................... 438/73, 438/199, 151, 48, 128, 157, 283, 59, 153, 438/149, 72
See application file for complete search history.

(56) References Cited

U.S. PATENT DOCUMENTS

| 4,759,610 A * | 7/1988 | Yanagisawa ................... 349/162 |
| 5,459,595 A * | 10/1995 | Ishiguro et al. ................. 349/111 |
| 5,963,290 A * | 10/1999 | Murai et al. ................... 349/191 |
| 6,421,039 B1 * | 7/2002 | Moon et al. .................... 345/100 |
| 2001/0019372 A1 * | 9/2001 | Ootsu et al. ..................... 349/38 |

* cited by examiner

*Primary Examiner* — Chuong A. Luu
(74) *Attorney, Agent, or Firm* — Jianq Chyun IP Office

(57) ABSTRACT

A fabricating method of a TFT array substrate includes following steps: providing a substrate having a pixel region and a bonding pad region surrounding the pixel region; forming a patterned polysilicon layer within the pixel region on the substrate; forming a first patterned insulating layer to cover the patterned polysilicon layer; forming a first patterned transparent conductive layer on the first patterned insulating layer; forming a first metal layer on the first patterned transparent conductive layer; forming a second patterned insulating layer to cover the first metal layer; forming a second patterned transparent conductive layer on the second patterned insulating layer; forming a second metal layer on the second patterned transparent conductive layer; forming a third patterned insulating layer to cover the second metal layer; and forming a third patterned transparent conductive layer on the third patterned insulating layer.

9 Claims, 21 Drawing Sheets

FABRICATING METHOD OF THIN FILM TRANSISTOR ARRAY SUBSTRATE

CROSS-REFERENCE TO RELATED APPLICATION

This application is a divisional application of and claims the priority benefit of an application Ser. No. 12/396,492, filed on Mar. 3, 2009, now U.S. Pat. No. 7,812,352, which claims the priority benefit of Taiwan application serial no. 97124764, filed on Jul. 1, 2008. The entirety of each of the above-mentioned patent applications is hereby incorporated by reference herein and made a part of specification.

BACKGROUND OF THE INVENTION

1. Field of the Invention

The invention generally relates to fabricating methods of thin film transistor array substrates (TFT array substrates), and more particularly, to fabricating methods of TFT array substrates with high aperture ratio and large storage capacitors.

2. Description of Related Art

Along with the progresses of photoelectric technology and semiconductor process, a thin film transistor liquid crystal display (TFT-LCD) has played the major role among various display apparatuses. A TFT-LCD mainly comprises a TFT array substrate, a color filter substrate (CF substrate) and a liquid crystal layer. The TFT array substrate includes a plurality of pixel structures arranged in an array, and each of the pixel structures includes a thin film transistor (TFT) and a pixel electrode. To maintain good display quality of the TFT-LCD, a storage capacitor is further formed in each pixel structure.

FIG. 1A is a top view diagram of a conventional TFT array substrate with low-temperature polysilicon TFTs (LTPS-TFT). FIG. 1B is the sectional diagram of FIG. 1A along line A-A'. Referring to FIGS. 1A and 1B, the TFT array substrate 100 includes a substrate 110, a patterned polysilicon layer 120, a first patterned insulating layer 130, a first metal layer 140, a second patterned insulating layer 150, a second metal layer 160, a third patterned insulating layer 170 and a transparent conductive layer 180, and the transparent conductive layer 180 contains a pixel electrode 180a.

Referring to FIGS. 1A and 1B, the substrate 110 has a pixel region 112 and a bonding pad region 114 located surrounding the pixel region 112. The patterned polysilicon layer 120 is disposed on the substrate 110 and includes a source 122 and a drain 124. The first patterned insulating layer 130 covers the patterned polysilicon layer 120. The first metal layer 140 is disposed on the first patterned insulating layer 130 and includes a gate 142, a scan line 144 electrically connected to the gate 142 and a common electrode 146 disposed within the pixel region 112. The second patterned insulating layer 150 covers the first metal layer 140, and a contact hole 190 is disposed in the first patterned insulating layer 130 and the second patterned insulating layer 150 to expose the drain 124. The second metal layer 160 is disposed on the second patterned insulating layer 150 and is electrically connected to the drain 124 via the contact hole 190. The second metal layer 160 further includes a data line 162 electrically connected to the source 122 via another contact hole 192.

The third patterned insulating layer 170 covers the second metal layer 160 and has a contact hole 194 to expose the second metal layer 160 electrically connected to the drain 124. The pixel electrode 180a is electrically connected to the second metal layer 160 via the contact hole 194, and then electrically connected to the drain 124. As shown in FIG. 1B, the drain 124 within the pixel region 112, the first patterned insulating layer 130, the common electrode 146, the second patterned insulating layer 150 and the second metal layer 160 together form a storage capacitor Cst.

FIG. 1C is a diagram showing a transparent region and an opaque region of the TFT array substrate of FIG. 1A. Referring to FIGS. 1A and 1C, the TFT array substrate 100 has a transparent region 102 and an opaque region 104 therewithin. It can be seen hereinbefore that the area occupied by the metal film layer (i.e., the first metal layer 140 and the second metal layers 160 as shown in FIG. 1A) would be opaque. Especially as shown by FIGS. 1A and 1B, the storage capacitor Cst within the pixel region 112 has the common electrode 146 and the second metal layer 160, so that the area occupied by the storage capacitor Cst becomes the opaque region 104, which largely reduces the aperture ratio of the TFT array substrate 100.

FIG. 2A is a top view diagram of a conventional TFT array substrate with amorphous silicon thin film transistors (a-Si TFTs). FIG. 2B is the sectional diagram of FIG. 2A along line D-D'. The TFT array substrate 200 includes a substrate 210, a first metal layer 220, a first insulating layer 230, a channel layer 240, a second metal layer 250, a second insulating layer 260 and a transparent conductive layer 270, and the transparent conductive layer 270 contains a pixel electrode 270a.

Referring to FIGS. 2A and 2B, the substrate 210 has a pixel region 212 and a bonding pad region 214 located surrounding the pixel region 212. The first metal layer 220 is disposed on the substrate 210 and includes a gate 222, a scan line 224 electrically connected to the gate 222 and a common electrode 226 located within the pixel region 212. The first insulating layer 230 covers the first metal layer 220. The channel layer 240 is disposed on the first insulating layer 230 over the gate 222. The second metal layer 250 is disposed on the first insulating layer 230, and includes a source 252 and a drain 254 both disposed respectively at two sides of the channel layer 240, and a data line 256 electrically connected to the source 252. The second insulating layer 260 covers the second metal layer 250 and exposes the drain 254. The pixel electrode 270a is disposed on the second insulating layer 260 and electrically connected to the drain 254. Especially as shown by FIGS. 2A and 2B, the common electrode 226 within the pixel region 212, the first insulating layer 230, the second insulating layer 260 and the pixel electrode 270a together form a storage capacitor Cst.

FIG. 2C is a diagram showing a transparent region and an opaque region of the TFT array substrate of FIG. 2A. Referring to FIGS. 2A and 2C, the TFT array substrate 200 has a transparent region 202 and an opaque region 204 therewithin. The area occupied by the metal film layer (i.e., the first metal layer 220 and the second metal layers 250 as shown in FIG. 2A) would be opaque. Especially, the common electrode 226 occupies the most area of the pixel region 212, so that the aperture ratio of the TFT array substrate 200 is largely reduced.

FIG. 3A is a top view diagram of another conventional TFT array substrate with amorphous silicon thin film transistors (a-Si TFTs). FIG. 3B is the sectional diagram of FIG. 3A along line E-E'. Referring to FIGS. 3A and 3B, the TFT array substrate 202 is similar to the TFT array substrate 200 of FIG. 2A, and same components of TFT array substrates 200 and 202 are represented with the same marks. Notice that, the storage capacitor of the TFT array substrate 202 has a different design from that of the TFT array substrate 200.

In the TFT array substrate 202 as shown by FIG. 3B, a common electrode 226, a first insulating layer 230, a second metal layer 250, a second insulating layer 260 and a pixel electrode 270a together form a dual storage capacitor. Because the common electrode 226 is a metal film layer and thereby is opaque, the aperture ratio of the TFT array substrate 202 is reduced. It can be seen from the conventional TFT array substrates 100, 200 and 202 that in order to increase the capacitance of the storage capacitor thereof, the areas of the common electrode 146 and 226 must be enlarged, which consequently reduces the aperture ratios of the TFT array substrates 100, 200 and 202.

FIG. 4A is the sectional diagram of FIG. 1A along line B-B'. FIG. 4B is the sectional diagram of FIG. 1A along line C-C'. Referring to FIGS. 1A and 4A, the TFT array substrate 100 has a scan bonding pad 114a, which includes the substrate 110, the first patterned insulating layer 130, the first metal layer 140, the second patterned insulating layer 150, the third patterned insulating layer 170 and the transparent conductive layer 180. The transparent conductive layer 180 is electrically connected to the first metal layer 140 via a contact hole 172.

Referring to FIGS. 1A and 4B, a data bonding pad 114b includes the substrate 110, the first insulating layer 130, the second insulating layer 150, the second metal layer 160, the third insulating layer 170 and the transparent conductive layer 180. The transparent conductive layer 180 is electrically connected to the second metal layer 160 via the contact hole 172.

Note that, the first metal layer 140 and the second metal layer 160 are usually made of Cr, Mo, AlNd/AlNdN or Mo/Al/Mo. Thus, the surfaces of the first metal layer 140 and the second metal layer 160 are easily oxidized. To solve the oxidizing problem, after forming the first metal layer 140 and the second metal layer 160, usually nitrogen gas is injected so that nitriding metal film layers 140' and 160' are formed respectively on the surfaces of the first metal layer 140 and the second metal layer 160.

However, the transparent conductive layer 180 is usually made of indium tin oxide (ITO), and the contact resistances between the ITO and the nitriding metal film layers 140' and 160' are quite high. Therefore, the scan bonding pad 114a and the data bonding pad 114b have higher contact resistance, and the electronic signals passing through the scan bonding pad 114a and the data bonding pad 114b are weakened seriously.

SUMMARY OF THE INVENTION

Accordingly, the invention is directed to a fabricating method of a TFT array substrate. The fabricating method is suitable to fabricate a TFT array substrate with high aperture ratio and large storage capacitance, and low contact resistance of the scan bonding pad or data bonding pad thereof can be obtained.

The invention provides a fabricating method of a TFT array substrate. The fabricating method includes following steps: providing a substrate, wherein the substrate has a pixel region and a bonding pad region located surrounding the pixel region; forming a patterned polysilicon layer within the pixel region on the substrate, wherein the patterned polysilicon layer includes a source and a drain; forming a first patterned insulating layer to cover the patterned polysilicon layer; forming a first patterned transparent conductive layer on the first patterned insulating layer; forming a first metal layer on the first patterned transparent conductive layer, wherein the first metal layer is partially disposed on the first patterned transparent conductive layer and includes a gate, a scan line electrically connected to the gate and a common line disposed within the pixel region, and a part of the first patterned transparent conductive layer is disposed under the common line; forming a second patterned insulating layer to cover the first metal layer, wherein the first patterned insulating layer and the second patterned insulating layer have a first contact hole to expose the drain; forming a second patterned transparent conductive layer on the second patterned insulating layer, wherein a part of the second patterned transparent conductive layer is electrically connected to the drain via the first contact hole; forming a second metal layer on the second patterned transparent conductive layer, wherein the second metal layer is partially disposed on the second patterned transparent conductive layer and includes a data line electrically connected to the source, and a part of the second patterned transparent conductive layer is disposed under the data line; forming a third patterned insulating layer to cover the second metal layer, wherein the third patterned insulating layer has a second contact hole to expose the second patterned transparent conductive layer electrically connected to the drain; forming a third patterned transparent conductive layer on the third patterned insulating layer, wherein the third patterned transparent conductive layer includes a pixel electrode located within the pixel region, and the pixel electrode is electrically connected to the second patterned transparent conductive layer via the second contact hole.

In an embodiment, the above-mentioned fabricating method of a TFT array substrate further includes forming a scan bonding pad within the bonding pad region, wherein the scan bonding pad is electrically connected to the scan line. The method of forming the scan bonding pad includes following steps: first, forming the first patterned transparent conductive layer within the bonding pad region; then, forming the first metal layer on the first patterned transparent conductive layer, wherein the first metal layer has a contact hole; after that, forming the third patterned transparent conductive layer on the first metal layer, wherein the third patterned transparent conductive layer is electrically connected to the first patterned transparent conductive layer via the contact hole.

In an embodiment, the above-mentioned fabricating method of a TFT array substrate further includes forming a data bonding pad within the bonding pad region, wherein the data bonding pad is electrically connected to the data line. The method of forming the data bonding pad includes following steps: first, forming the second patterned transparent conductive layer within the bonding pad region; then, forming the second metal layer on the second patterned transparent conductive layer, wherein the second metal layer has a contact hole; after that, forming the third patterned transparent conductive layer on the second metal layer, wherein the third patterned transparent conductive layer is electrically connected to the second patterned transparent conductive layer via the contact hole.

In an embodiment, the above-mentioned fabricating method of a TFT array substrate further includes forming the second metal layer on the second patterned transparent conductive layer over the common line, wherein the pixel structure is electrically connected to the second metal layer via the second contact hole.

In an embodiment, the method of forming the above-mentioned common line and first patterned transparent conductive layer includes following steps: first, forming a first transparent conductive material layer on the substrate; then, forming a first metal material layer on the first transparent conductive material layer; after that, taking a half-tone photomask as a mask to conduct a lithography-etching process on the first metal material layer and the first transparent conductive material layer so as to form the common line and the first patterned transparent conductive layer.

The invention further provides a fabricating method of a TFT array substrate. The fabricating method includes following steps: providing a substrate, wherein the substrate has a pixel region and a bonding pad region located surrounding the pixel region; forming a first patterned transparent conductive layer on the substrate; forming a first metal layer on a part of the first patterned transparent conductive layer, wherein the first metal layer includes a gate, a scan line electrically connected to the gate and a common line within the pixel region, and a part of the first patterned transparent conductive layer is disposed under the common line; forming a first insulating layer to cover the first metal layer; forming a channel layer on the first insulating layer over the gate; forming a second patterned transparent conductive layer on the substrate; forming a second metal layer on a part of the second patterned transparent conductive layer, wherein the second metal layer includes a source and a drain respectively disposed at both sides of the channel layer and a data line electrically connected to the source, wherein a part of the second patterned transparent conductive layer is disposed under the drain; forming a second insulating layer to cover the second metal layer and expose the second patterned transparent conductive layer under the drain; forming a third patterned transparent conductive layer on the substrate, wherein the third patterned transparent conductive layer includes a pixel electrode electrically connected to the second patterned transparent conductive layer under the drain.

In an embodiment, the method of forming the common line and the first patterned transparent conductive layer together serving as the lower electrode of a storage capacitor includes following steps: first, forming a first transparent conductive material layer on the substrate; then, forming a first metal material layer on the first transparent conductive material layer; after that, taking a half-tone photomask as a mask to conduct a lithography-etching process on the first metal material layer and the first transparent conductive material layer so as to form the common line and the first patterned transparent conductive layer.

In an embodiment, the above-mentioned fabricating method of a TFT array substrate further includes forming a scan bonding pad within the bonding pad region, wherein the scan bonding pad is electrically connected to the scan line. The method of forming the scan bonding pad includes following steps: first, forming the first patterned transparent conductive layer within the bonding pad region; then, forming the first metal layer on the first patterned transparent conductive layer, wherein the first metal layer has a contact hole; after that, forming the third patterned transparent conductive layer on the first metal layer, wherein the third patterned transparent conductive layer is electrically connected to the first patterned transparent conductive layer via the contact hole.

In an embodiment, the above-mentioned fabricating method of a TFT array substrate further includes forming a data bonding pad within the bonding pad region, wherein the data bonding pad is electrically connected to the data line. The method of forming the data bonding pad includes following steps: first, forming the second patterned transparent conductive layer within the bonding pad region; then, forming the second metal layer on the second patterned transparent conductive layer, wherein the second metal layer has a contact hole; after that, forming the third patterned transparent conductive layer on the second metal layer, wherein the third patterned transparent conductive layer is electrically connected to the second patterned transparent conductive layer via the contact hole.

Since, in the invention, the first patterned transparent conductive layer is disposed under the first metal layer and the first patterned transparent conductive layer is disposed under the second metal layer, and the first patterned transparent conductive layer and the second patterned transparent conductive layer are used to respectively substitute the first metal layer and the second metal layer serving as the lower electrode in the storage capacitor; therefore, the invention can increase the aperture ratio of the TFT array substrate and meanwhile maintain a good storage capacitance. In addition, the scan bonding pad and the data bonding pad in the TFT array substrate have low contact resistances, which facilitates delivering electronic signals.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
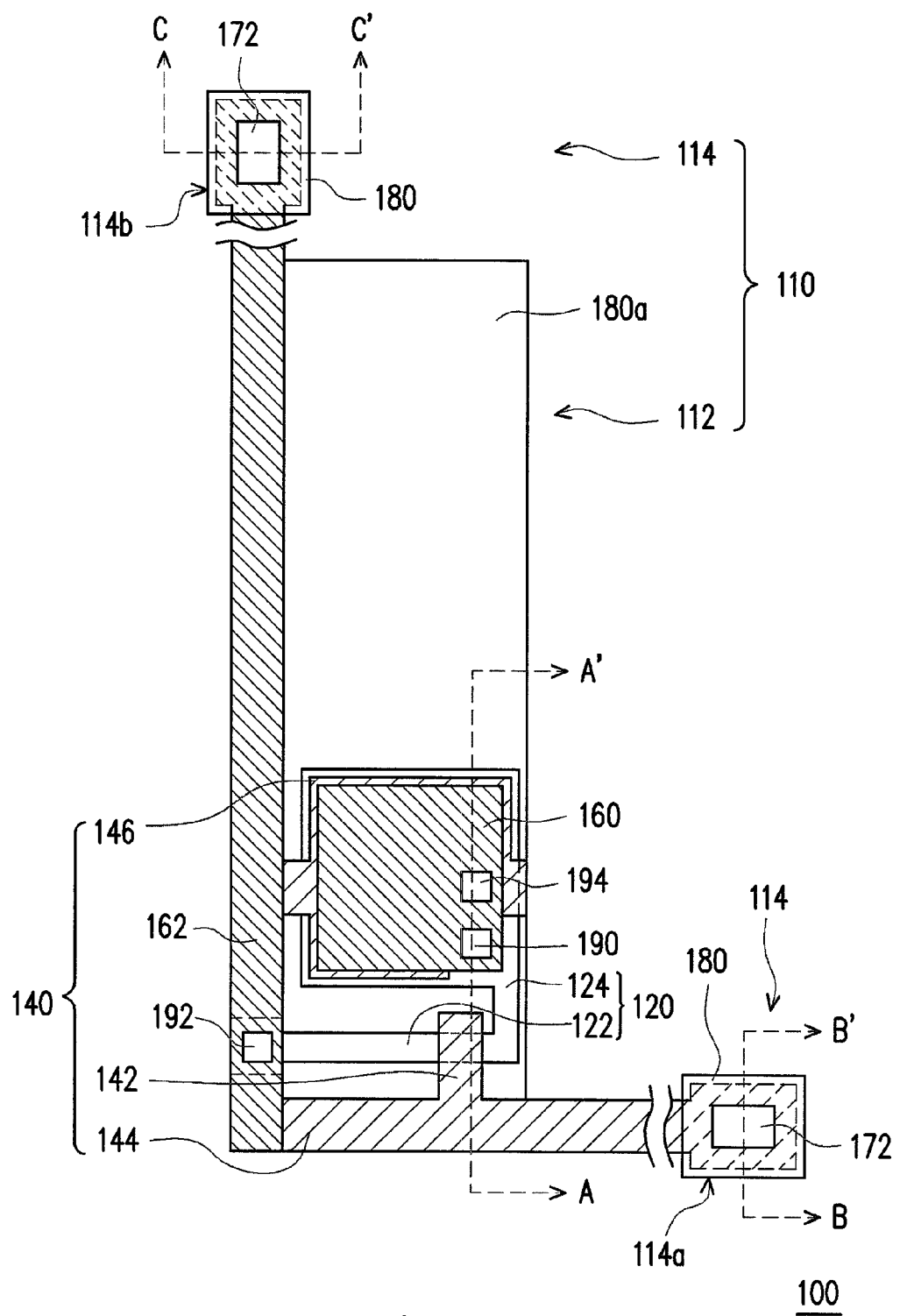
FIG. 1A is a top view diagram of a conventional TFT array substrate with low-temperature polysilicon TFTs.
Figure 1B:
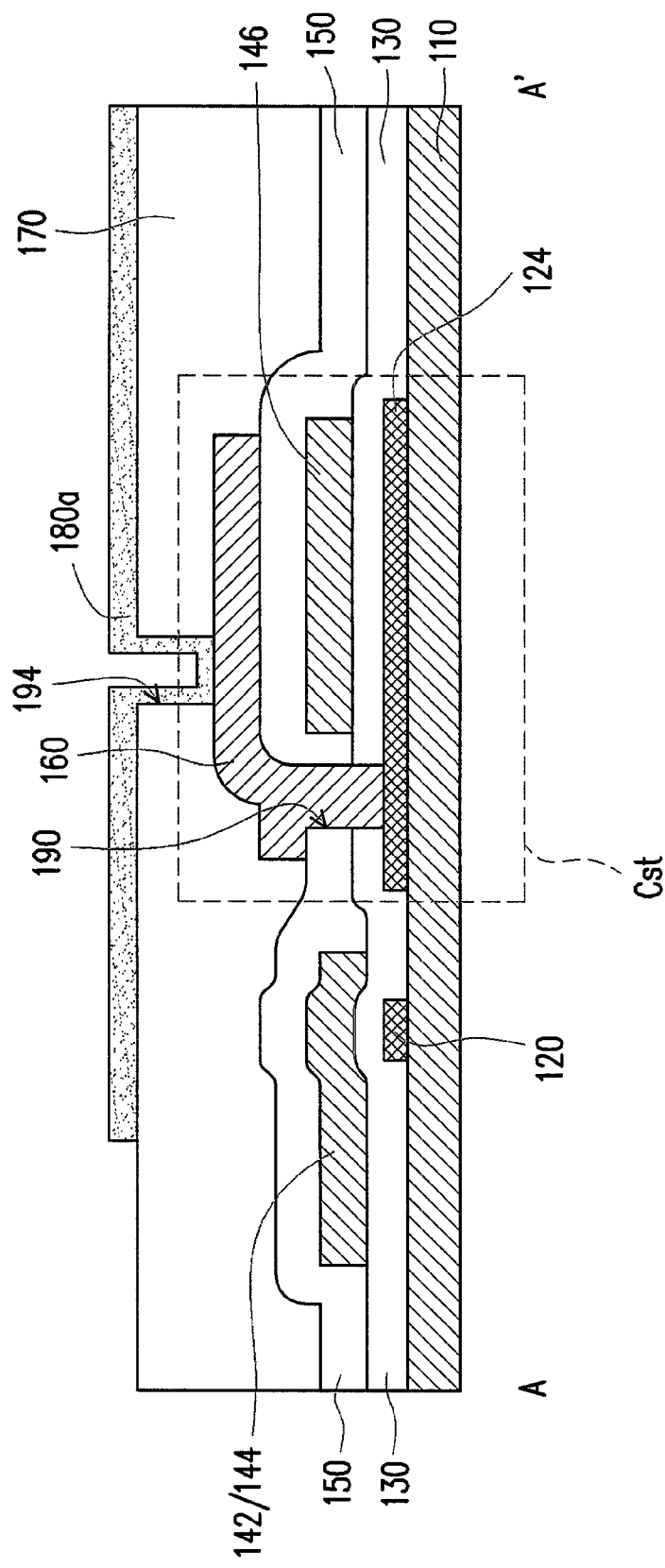
FIG. 1B is the sectional diagram of FIG. 1A along line A-A'.
Figure 1C:
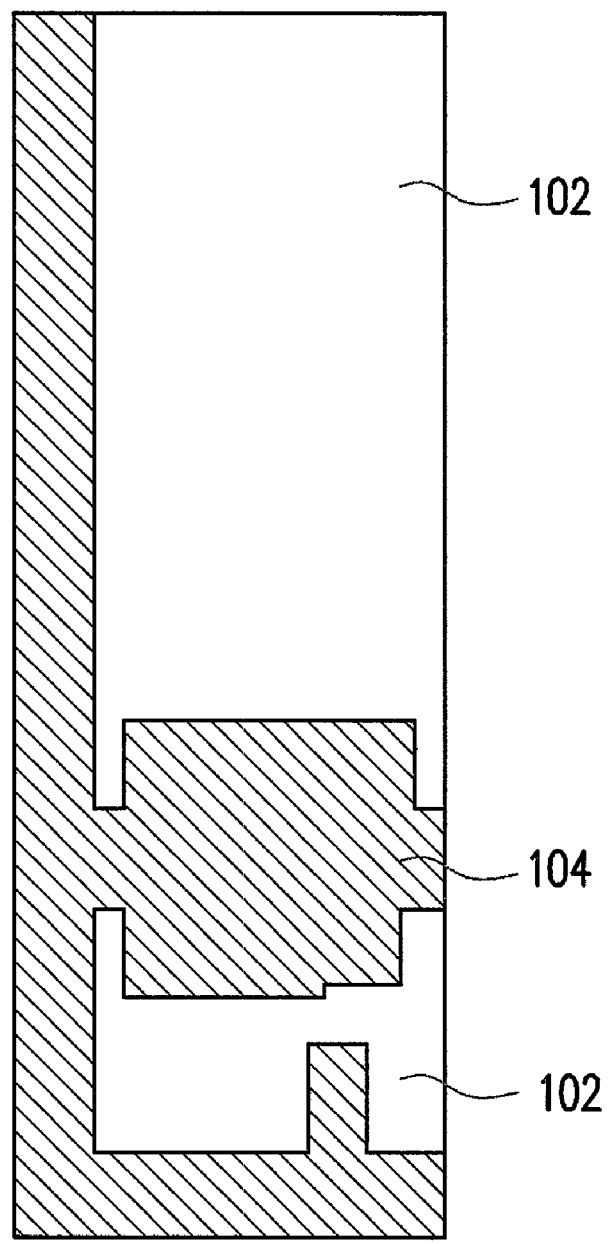
FIG. 1C is a diagram showing a transparent region and an opaque region of the TFT array substrate of FIG. 1A.

Reference will now be made in detail to the present embodiments of the invention, examples of which are illustrated in the accompanying drawings. Wherever possible, the same reference numbers are used in the drawings and the description to refer to the same or like parts.

The TFT Array Substrate with LTPS-TFTs

The First Embodiment

Figure 5A:
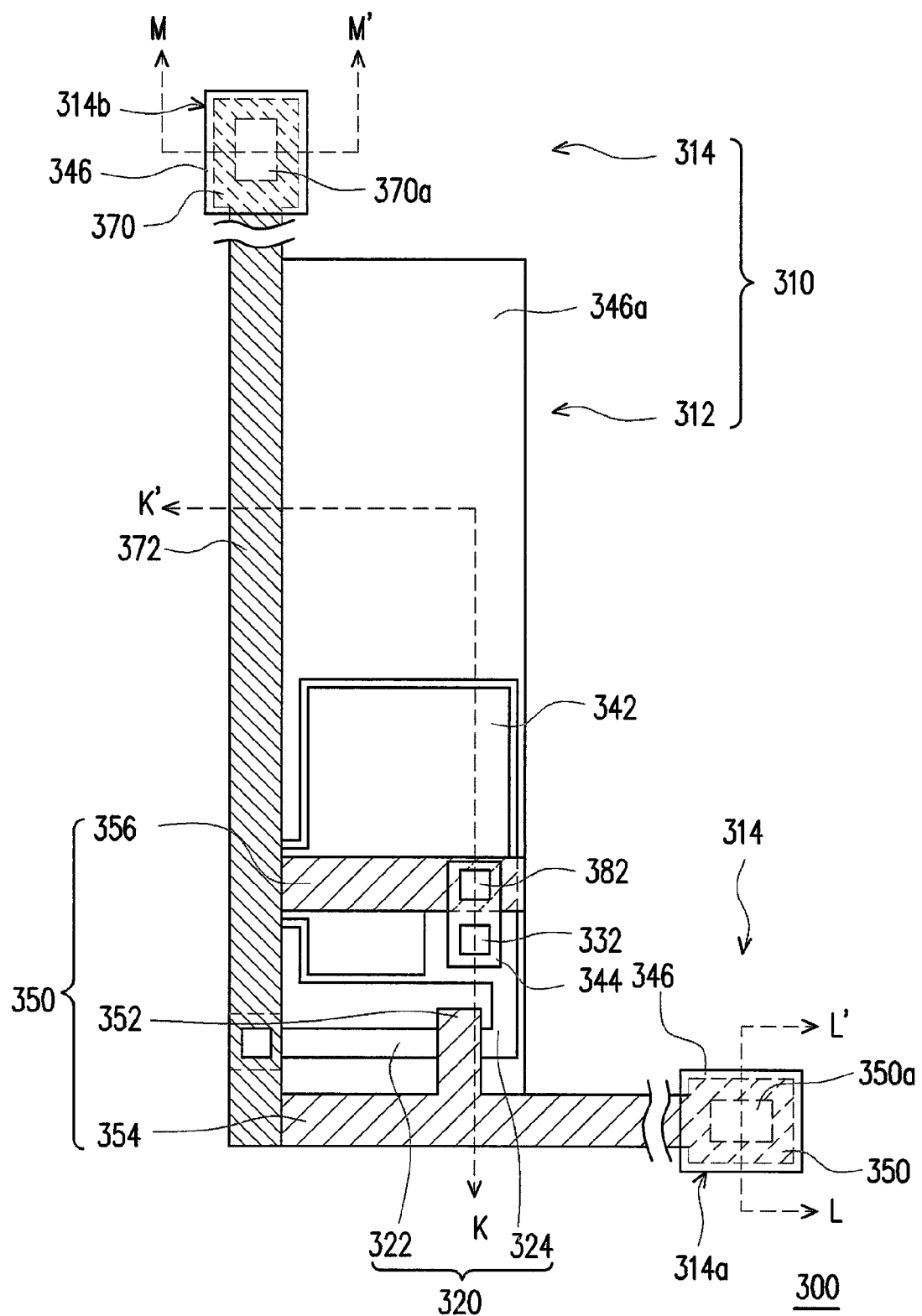
FIG. 5A is a top view diagram of a TFT array substrate with LTPS-TFTs according to an embodiment of the invention.
Figure 5B:
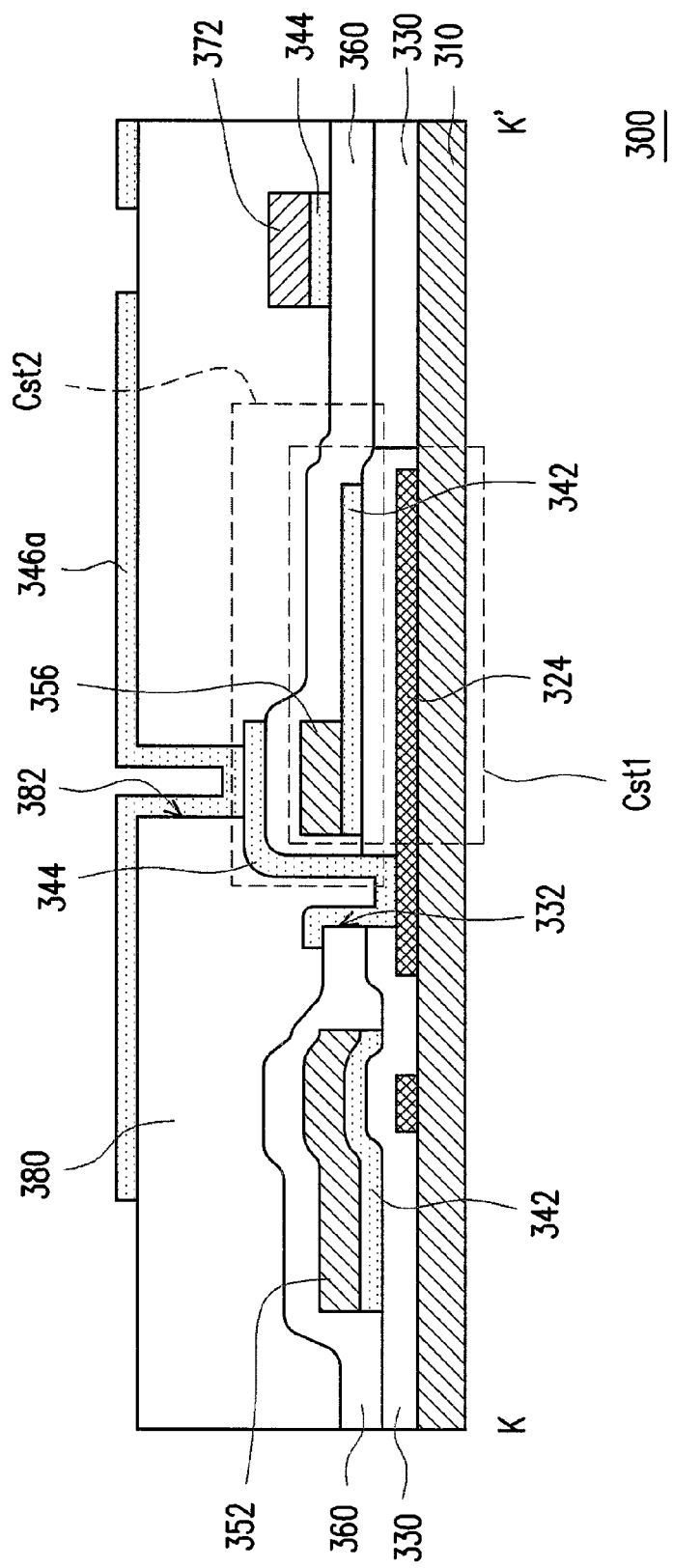
FIG. 5B is the sectional diagram of FIG. 5A along line K-K'.

FIG. 5A is a top view diagram of a TFT array substrate with LTPS-TFTs according to an embodiment of the invention. FIG. 5B is the sectional diagram of FIG. 5A along line K-K'. Referring to FIGS. 5A and 5B, the TFT array substrate 300 includes a substrate 310, a patterned polysilicon layer 320, a first patterned insulating layer 330, a first patterned transparent conductive layer 342, a first metal layer 350, a second patterned insulating layer 360, a second patterned transparent conductive layer 344, a second metal layer 370, a third patterned insulating layer 380 and a third patterned transparent conductive layer 346.

Referring to FIGS. 5A and 5B, the substrate 310 has a pixel region 312 and a bonding pad region 314 located surrounding the pixel region 312. The substrate 310 may be a glass substrate or a quartz substrate. The patterned polysilicon layer 320 is disposed within the pixel region 312 on the substrate 310 and includes a source 322 and a drain 324. Especially, the drain 324 of the patterned polysilicon layer 320 extends into the pixel region 312, and the thickness of the patterned polysilicon layer 320 is about 500 Å for allowing light being transmitted therethrough.

The first patterned insulating layer 330 (as shown in FIG. 5B) covers the patterned polysilicon layer 320. The first patterned insulating layer 330 is made of, for example, silicon oxide, silicon nitride, silicon nitride oxide or other similar materials.

The first patterned transparent conductive layer 342 is disposed on the first patterned insulating layer 330. The first patterned transparent conductive layer 342 is made of, for example, indium tin oxide (ITO), indium zinc oxide (IZO) or other similar materials. Especially, the first metal layer 350 is partially disposed on the first patterned transparent conductive layer 342. The first metal layer 350 includes a gate 352, a scan line 354 electrically connected to the gate 352 and a common line 356 disposed within the pixel region 312. Specifically, part of the first patterned transparent conductive layer 342 is disposed under the common line 356. The first metal layer 350 is made of, for example, Cr, Mo, AlNd/ AlNdN, Mo/Al/Mo.

The second patterned insulating layer 360 (as shown in FIG. 5B) covers the first metal layer 350. The first patterned insulating layer 330 and the second patterned insulating layer 360 have a first contact hole 332 to expose the drain 324. The second patterned insulating layer 360 is made of, for example, silicon oxide, silicon nitride, silicon nitride oxide or other similar materials.

The second patterned transparent conductive layer 344 is disposed on the second patterned insulating layer 360. A part of the second patterned transparent conductive layer 344 is electrically connected to the drain 324 via the first contact hole 332. The second patterned transparent conductive layer 344 is made of, for example, ITO, IZO or other similar materials. Especially, the second metal layer 370 is partially disposed on the second patterned transparent conductive layer 344. The second metal layer 370 includes a data line 372 electrically connected to the source 322, and a part of the second patterned transparent conductive layer 344 is disposed under the data line 372.

Referring to FIGS. 5A and 5B, the third patterned insulating layer 380 covers the second metal layer 370 and has a second contact hole 382 to expose the second patterned transparent conductive layer 344 electrically connected to the drain 324. The third patterned insulating layer 380 is made of, for example, silicon oxide, silicon nitride, silicon nitride oxide or other similar materials.

The third patterned transparent conductive layer 346 is disposed on the third patterned insulating layer 380 and includes a pixel electrode 346a, which is electrically connected to the second patterned transparent conductive layer 344 via the second contact hole 382.

To sum up, in the TFT array substrate 300 as shown in FIGS. 5A and 5B, the first patterned transparent conductive layer 342 is disposed under the first metal layer 350, and the only opaque area within the pixel region 312 is the area existed with the common line 356 which is made of metal for providing capacitor's voltage; in other words, the embodiment uses the first patterned transparent conductive layer 342 and a part of the common line 356 located over the first patterned transparent conductive layer 342 to substitute the common electrode 146 with a large area (as shown in FIG. 1A) in the prior art. Therefore, the present embodiment can increase the aperture ratio and maintain large storage capacitance.

In detail, referring to FIG. 5B, the drain 324, the first patterned insulating layer 330 and the first patterned transparent conductive layer 342 under the common line 356 together form a first storage capacitor Cst1, and the first patterned transparent conductive layer 342 under the common line 356, the second patterned insulating layer 360 and the second patterned transparent conductive layer 344 over the common line 356 together form a second storage capacitor Cst2, which means the TFT array substrate 300 has a bilayer capacitor structure.

Specially, since the common line 356 is partially located on the first patterned transparent conductive layer 342, thus, the light (not shown) is able to transmit through the first storage capacitor Cst1, which results in high aperture ratio in the TFT array substrate 300. In addition, the first patterned transparent conductive layer 342 within the pixel region 312 can also serve as the common electrode, which results in large storage capacitance in the TFT array substrate 300 as well.

Figure 5C:
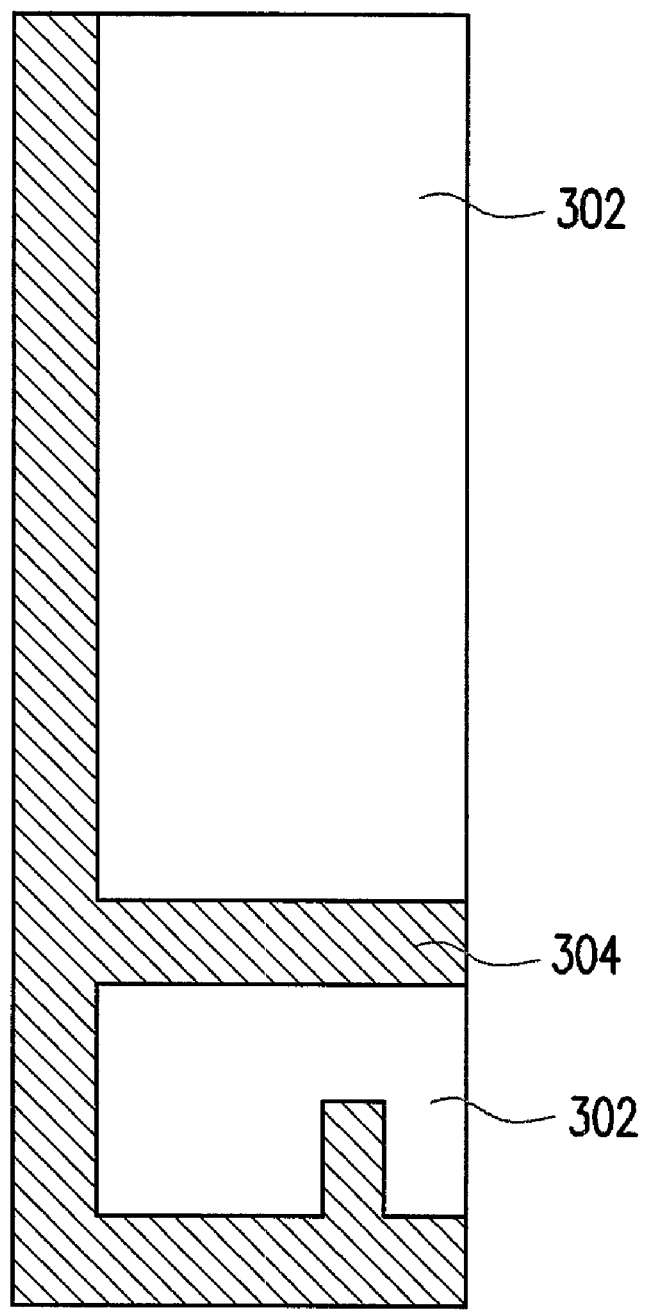
FIG. 5C is a diagram showing a transparent region and an opaque region of the TFT array substrate of FIG. 5A.

FIG. 5C is a diagram showing a transparent region and an opaque region of the TFT array substrate of FIG. 5A. Referring to FIGS. 5A and 5C, the region occupied by a metal material (i.e., the gate 352, the scan line 354, the common line 356 and the data line 372 as shown in FIG. 5A) is an opaque region 304 and the region occupied by the patterned transparent conductive layers 342 and 344 is a transparent region 302.

Within the pixel region 312, only the common line 356 utilizes the metal material, and the first patterned transparent conductive layer 342 substitutes the most area of the first metal layer 350, therefore, the TFT array substrate 300 has high aperture ratio. In addition, the first patterned transparent conductive layer 342 can also serve as the common electrode, which still results in large storage capacitance in the TFT array substrate 300.

Figure 5D:
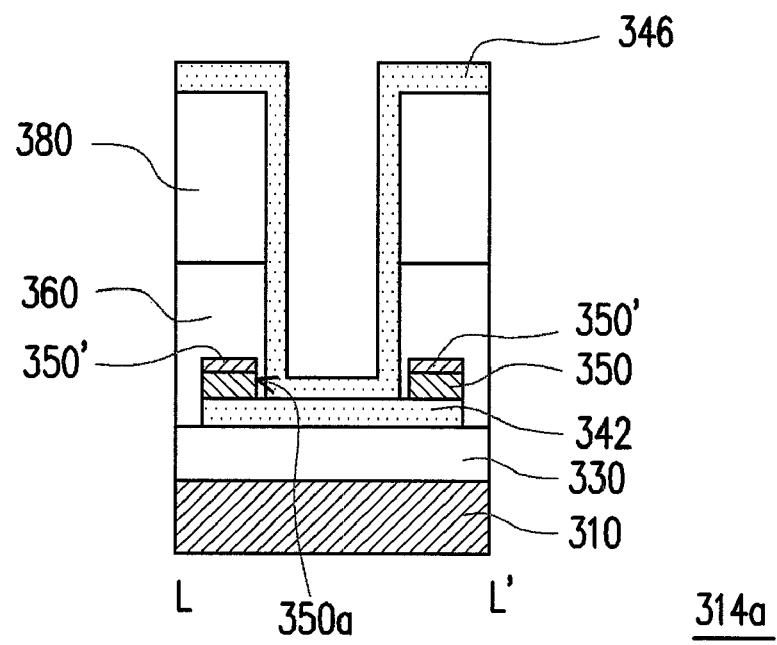
FIG. 5D is the sectional diagram of FIG. 5A along line L-L'.

FIG. 5D is the sectional diagram of FIG. 5A along line L-L'. Referring to FIGS. 5A and 5D, the TFT array substrate 300 further includes a scan bonding pad 314a, which is disposed within the bonding pad region 314 and electrically connected to the scan line 354. The scan bonding pad 314a includes the first patterned transparent conductive layer 342, the first metal layer 350 and the third patterned transparent conductive layer 346. The first metal layer 350 is disposed on the first patterned transparent conductive layer 342, and the first metal layer 350 has a contact hole 350a. The third patterned transparent conductive layer 346 is electrically connected to the first patterned transparent conductive layer 342 via the contact hole 350a.

Figure 5E:
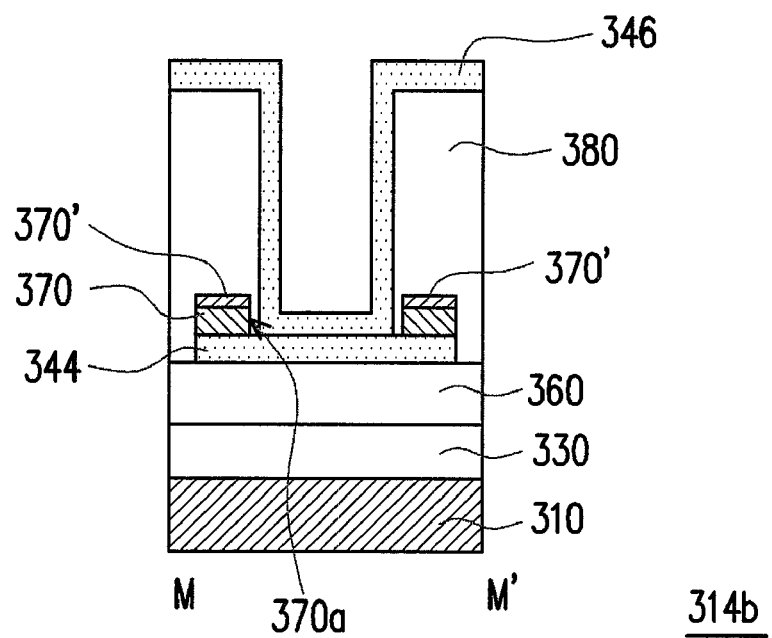
FIG. 5E is the sectional diagram of FIG. 5A along line M-M'.

FIG. 5E is the sectional diagram of FIG. 5A along line M-M'. Referring to FIGS. 5A and 5E, the TFT array substrate 300 further includes a data bonding pad 314b, which is disposed within the bonding pad region 314 and electrically connected to the data line 372. The data bonding pad 314b includes the second patterned transparent conductive layer 344, the second metal layer 370 and the third patterned transparent conductive layer 346. The second metal layer 370 is disposed on the second patterned transparent conductive layer 344 and has a contact hole 370a. The third patterned transparent conductive layer 346 is electrically connected to the second patterned transparent conductive layer 344 via contact hole 370a.

Note that, the first metal layer 350 of the scan bonding pad 314a has a contact hole 350a, thus, the third patterned transparent conductive layer 346 can contact the first patterned transparent conductive layer 342 under the first metal layer 350 via the contact hole 350a. Because the third patterned transparent conductive layer 346 and the first patterned transparent conductive layer 342 utilize the same material, the contact resistance at the interface between them is almost zero.

Especially, the third patterned transparent conductive layer 346 does not directly contact a nitriding metal film layer 350' over the first metal layer 350. Therefore, the contact resistance can be reduced substantially. The data bonding pad 314b shown in FIG. 5E is designed in the same way so as to facilitate delivering electronic signals.

The Second Embodiment

Figure 6A:
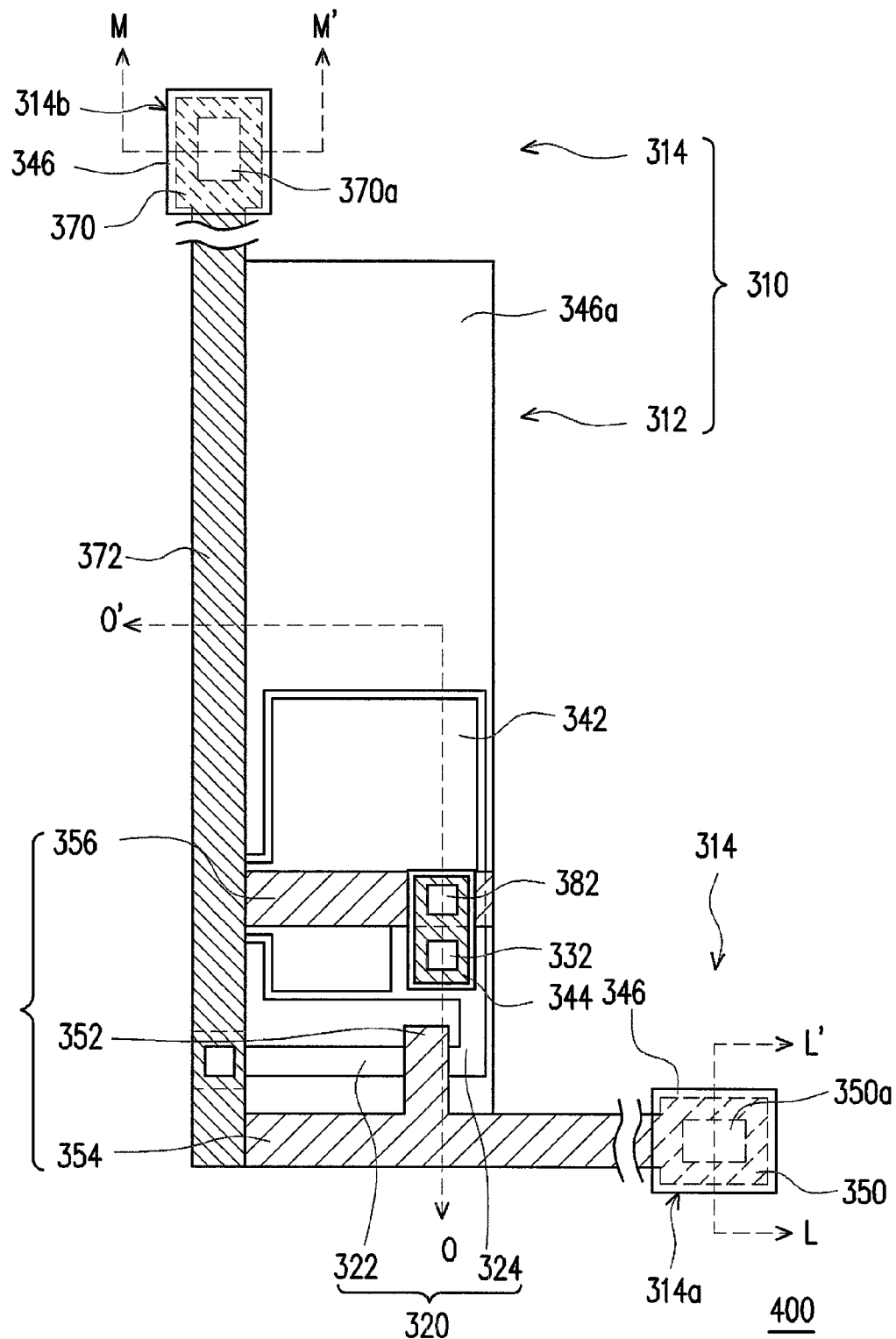
FIG. 6A is a top view diagram of a TFT array substrate with LTPS-TFTs according to another embodiment of the invention.
Figure 6B:
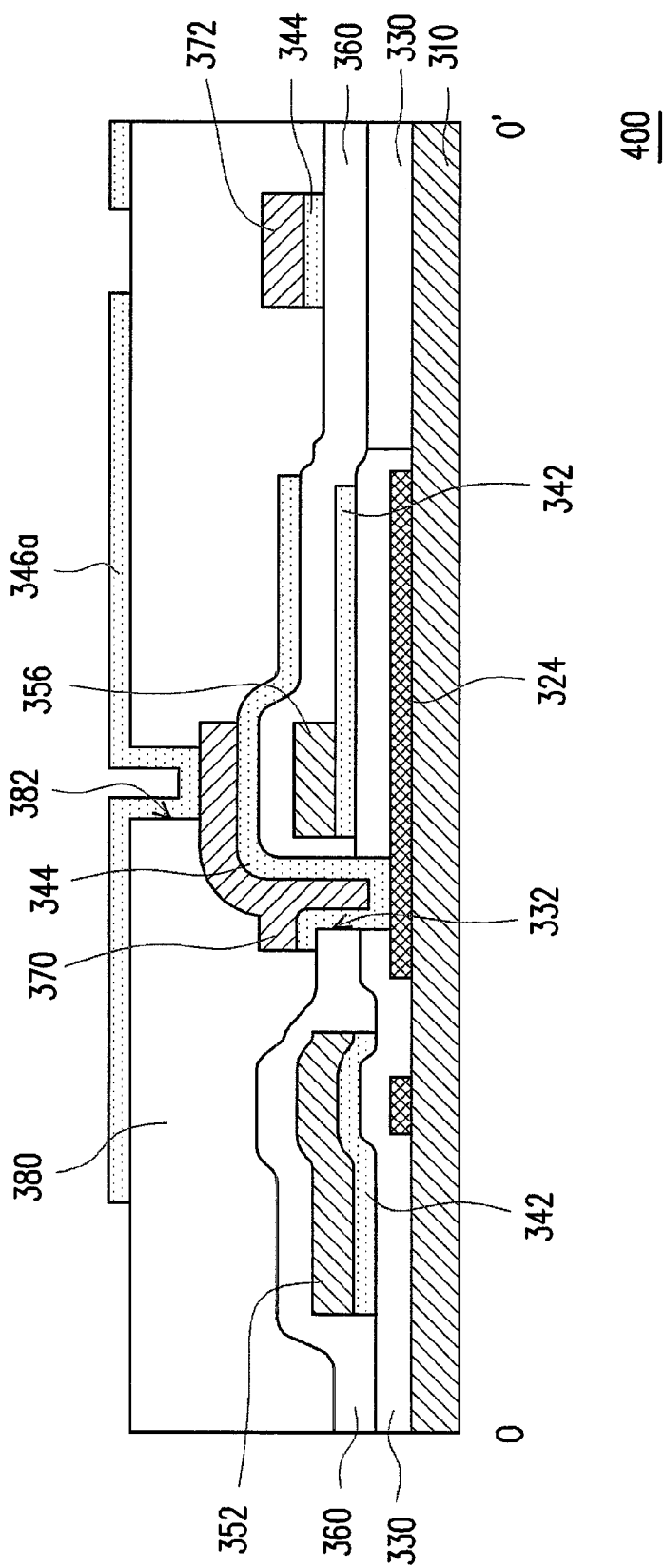
FIG. 6B is the sectional diagram of FIG. 6A along line O-O'.

FIG. 6A is a top view diagram of a TFT array substrate with LTPS-TFTs according to another embodiment of the invention. FIG. 6B is the sectional diagram of FIG. 6A along line O-O'.

The TFT array substrate 400 has the structure similar to the TFT array substrate 300 shown in FIGS. 5A and 5B, and the same components are represented with the same marks. In addition, the materials and the dispositions of the film layers of TFT array substrate 400 are similar to that in FIGS. 5A and 5B as well and detail description is omitted.

Note that, in the TFT array substrate 400 of the embodiment, the second metal layer 370 is also disposed on the second patterned transparent conductive layer 344 over the common line 356, and the pixel electrode 346a is electrically connected to the second metal layer 370 via the second contact hole 382. In this way, the formed bilayer capacitor structure has larger storage capacitance to further promote the display quality. The scan bonding pad 314a and the data bonding pad 314b in the TFT array substrate 400 are designed similarly to that shown in Figs. FIGS. 5D and 5E, and it is omitted to describe for simplicity.

The Fabricating Method of a TFT Array Substrate with LTPS-TFTs

The First Embodiment

Please referring to FIGS. 5A and 5B, the fabricating method of the TFT array substrate 300 includes following steps. First, a substrate 310 is provided, and the substrate 310 has a pixel region 312 and a bonding pad region 314 located surrounding the pixel region 312. The substrate 310 can be a glass substrate or a quartz substrate.

Next, a patterned polysilicon layer 320 is formed within the pixel region 312 on the substrate 310. The patterned polysilicon layer 320 includes a source 322 and a drain 324. The method of forming the patterned polysilicon layer 320 is, for example, forming a polysilicon layer (not shown) on the substrate 310, followed by conducting a lithography-etching process on the polysilicon layer for patterning purpose.

Then, a first patterned insulating layer 330 is formed to cover the patterned polysilicon layer 320. The method of forming the first patterned insulating layer 330 is, for example, conducting chemical vapor deposition (CVD) on the substrate 310 to depose a first insulating layer (not shown) and then conducting a patterning process to form the first patterned insulating layer 330. The material of the first patterned insulating layer 330 is, for example, silicon oxide, silicon nitride, silicon nitride oxide or other similar materials.

After that, a first patterned transparent conductive layer 342 is formed on the first patterned insulating layer 330 by using, for example, sputtering. The material of the first patterned transparent conductive layer 342 is, for example, ITO, IZO or other similar materials.

Further, a first metal layer 350 is formed on the first patterned transparent conductive layer 342. The first metal layer 350 is partially disposed on the first patterned transparent conductive layer 342 and includes a gate 352, a scan line 354 electrically connected to the gate 352 and a common line 356 disposed within the pixel region 312. A part of the first patterned transparent conductive layer 342 is disposed under the common line 356. The method of forming the first metal layer 350 is, for example, sputtering, and the material of the first metal layer 350 is, for example, Cr, Mo, AlNd/AlNdN, Mo/Al/Mo.

Note that, when fabricates the common line 356 of FIG. 5B and the first patterned transparent conductive layer 342 which also serves as the common electrode located under the common line 356, two photomasks are usually utilized. For reducing the number of the photomasks to simultaneously fabricate the common line 356 and the first patterned transparent conductive layer 342 of FIG. 5B, in another embodiment of the invention, a half-tone photomask or a gray-tone photomask instead of the above-mentioned two photomasks is used to form the above-mentioned structures in association with a lithography-etching process.

In more detail, referring to FIG. 5B, the method of forming the common line 356 and the first patterned transparent conductive layer 342 under the common line 356 includes following steps. First, a first transparent conductive material layer (not shown) is formed on the substrate 310. Next, a metal material layer (not shown) is formed on the first transparent conductive material layer. Then, a half-tone photomask (not shown) is used as the mask to conduct a lithography-etching process on the metal material layer and the first transparent conductive material layer, which forms the structure with a part of the common line 356 over the first patterned transparent conductive layer 342 as shown in FIG. 5B. The lithography-etching process by using the half-tone photomask or the gray-tone photomask is a well-known process, so it is omitted to describe.

After that, a second patterned insulating layer 360 is formed to cover the first metal layer 350. The first patterned insulating layer 330 and the second patterned insulating layer 360 have a first contact hole 332 to expose the drain 324. To form the second patterned insulating layer 360, for example, CVD is used to depose a second insulating layer (not shown) on the substrate 310, following by conducting a patterning process so as to form the first contact hole 332 in the first insulating layer (not shown) and the second insulating layer (not shown). In this step, the first patterned insulating layer 330 and the second patterned insulating layer 360 both having the first contact hole 332 are simultaneously formed. Similarly, the material of the second patterned insulating layer 360 is, for example, silicon oxide, silicon nitride, silicon nitride oxide or other similar materials.

Further, a second patterned transparent conductive layer 344 is formed on the second patterned insulating layer 360, and a part of the second patterned transparent conductive layer 344 is electrically connected to the drain 324 via the first contact hole 332.

After that, a second metal layer 370 is Formed on the second patterned transparent conductive layer 344, and the second metal layer 370 is partially disposed on the second patterned transparent conductive layer 344. The second metal layer 370 includes a data line 372 electrically connected to the source 322. A part of the second patterned transparent conductive layer 344 is disposed under the data line 372.

Further, a third patterned insulating layer 380 is formed to cover the second metal layer 370, and the third patterned insulating layer 380 has a second contact hole 382 to expose the second patterned transparent conductive layer 344 electrically connected to the drain 324. The method of forming the third patterned insulating layer 380 is, for example, forming a third insulating layer (not shown) on the substrate 310 to completely cover the substrate 310, following by patterning the third insulating layer to form the second contact hole 382.

And then, a third patterned transparent conductive layer 346 is formed on the third patterned insulating layer 380. The third patterned transparent conductive layer 346 includes a pixel electrode 346a located within the pixel region 312, and the pixel electrode 346a is electrically connected to the second patterned transparent conductive layer 344 via the second contact hole 382.

The above-mentioned fabricating method of the TFT array substrate 300 is suitable to fabricate a TFT array substrate with large storage capacitance and high aperture ratio. The fabrication method is also advantageous in saving photomasks by using a half-tone photomask or a gray-tone photomask.

Referring to FIGS. 5A and 5D, the above-mentioned fabricating method of the TFT array substrate 300 further includes forming a scan bonding pad 314a within the bonding pad region 314, and the scan bonding pad 314a is electrically connected to the scan line 354. The method of forming the scan bonding pad 314a includes following steps.

First, the first patterned transparent conductive layer 342 is formed within the bonding pad region 314, and the first patterned transparent conductive layer 342 is formed on the first patterned insulating layer 330 where the first patterned insulating layer 330 has been formed in a film layer on the substrate 310 already.

Next, the first metal layer 350 is formed on the first patterned transparent conductive layer 342. The first metal layer 350 has a contact hole 350a, and the contact hole 350a can be formed during simultaneously conducting an etching on the second patterned insulating layer 360, the third patterned insulating layer 380 and the first metal layer 350.

Then, the third patterned transparent conductive layer 346 is formed on the first metal layer 350, and the third patterned transparent conductive layer 346 is electrically connected to the first patterned transparent conductive layer 342 via the contact hole 350a.

Referring to FIGS. 5A and 5E, similarly to the above described, the fabricating method of the TFT array substrate 300 further includes forming a data bonding pad 314b within the bonding pad region 314, and the data bonding pad 314b is electrically connected to the data line 372. The method of forming the data bonding pad 314b includes following steps.

First, the second patterned transparent conductive layer 344 is formed within the bonding pad region 314 on the second patterned insulating layer 360 over the first patterned insulating layer 330.

Next, the second metal layer 370 is formed on the second patterned transparent conductive layer 344, and the second metal layer 370 has a contact hole 370a. Similarly, the contact hole 370a can be formed during simultaneously conducting an etching on the third patterned insulating layer 380 and the second metal layer 370.

Then, the third patterned transparent conductive layer 346 is formed on the second metal layer 370, and the third patterned transparent conductive layer 346 is electrically connected to the second patterned transparent conductive layer 344 via the contact hole 370a.

With the above-mentioned fabricating method of the TFT array substrate 300, the scan bonding pad 314a and the data bonding pad 314b having low contact resistance are fabricated, which facilitate delivering electronic signals.

The Second Embodiment

Referring to FIGS. 6A and 6B, the fabricating method of the TFT array substrate 400 is similar to that of the TFT array substrate 300, and the same components thereof are represented by the same marks.

Especially, in the TFT array substrate 400, further includes a step of forming the second metal layer 370 on the second patterned transparent conductive layer 344 over the common line 356, and the pixel electrode 346a is electrically connected to the second metal layer 370 via the second contact hole 382.

As shown in FIG. 6B, a part of the second patterned transparent conductive layer 344 is disposed under the second metal layer 370 and the other part of the second patterned transparent conductive layer 344 extends into the pixel region 312. Two photomasks are usually used to form the structure as shown in FIG. 6B; but for saving the photomasks herein, a half-tone photomask or a gray-tone photomask in association with a lithography-etching process is used to form the structure as shown in FIG. 6B.

In the embodiment, the scan bonding pad 314a and the data bonding pad 314b can have the same designs as the first embodiment so as to reduce the contact resistance, which is omitted to describe for simplicity.

The TFT Array Substrate with a-Si TFTs

The First Embodiment

Figure 7A:
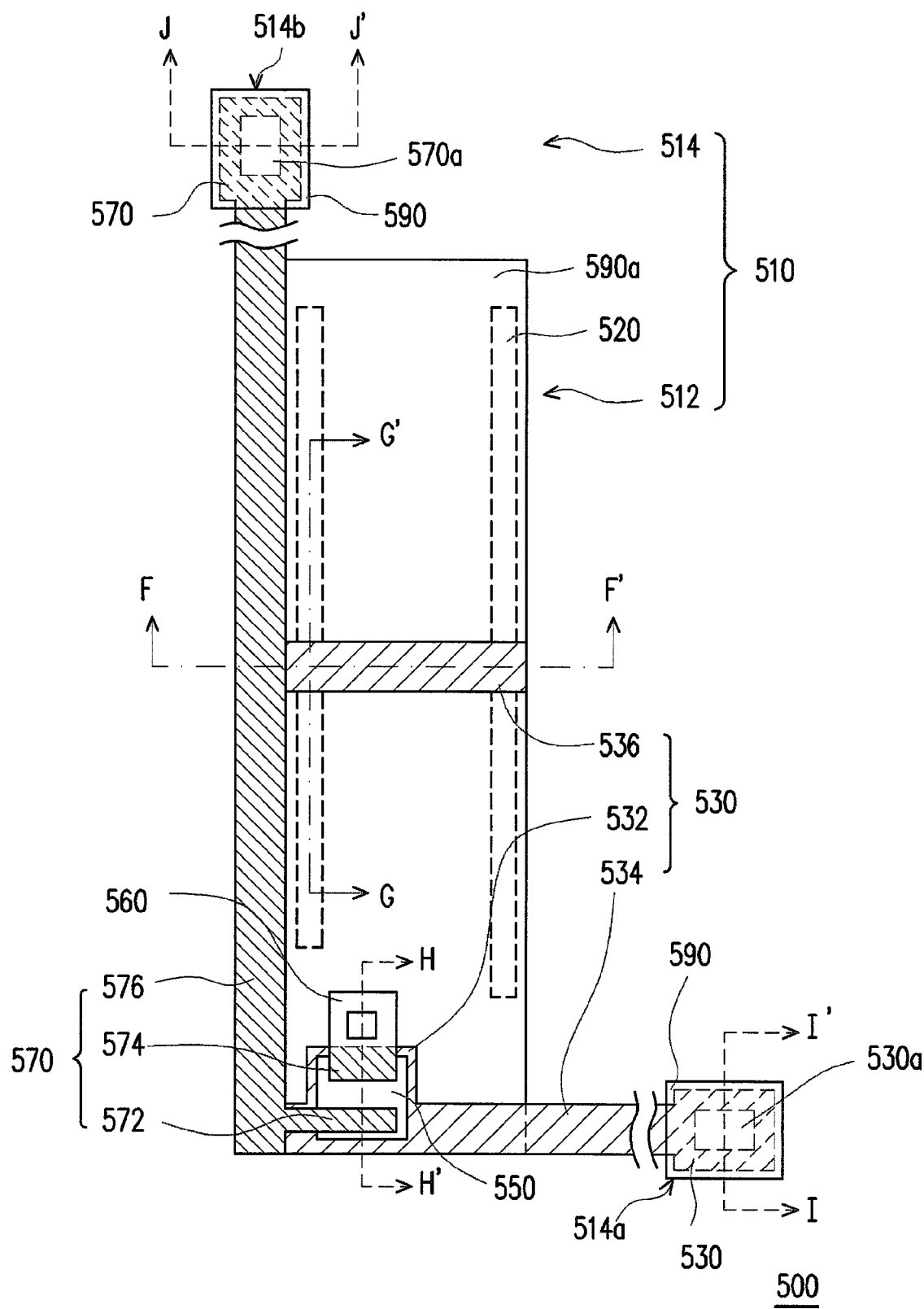
FIG. 7A is a top view diagram of a TFT array substrate with a-Si TFTs according to an embodiment of the invention.
Figure 7B:
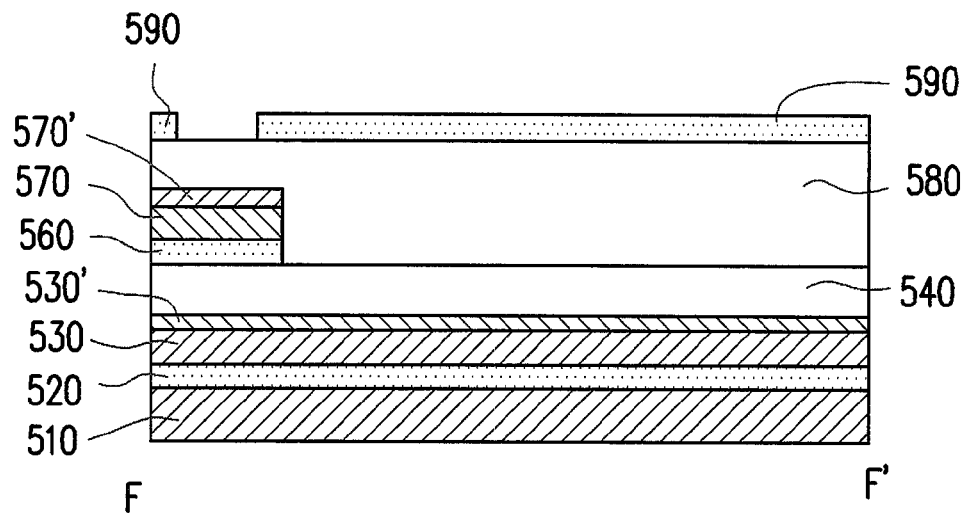
FIG. 7B is the sectional diagram of FIG. 7A along line F-F'.
Figure 7C:
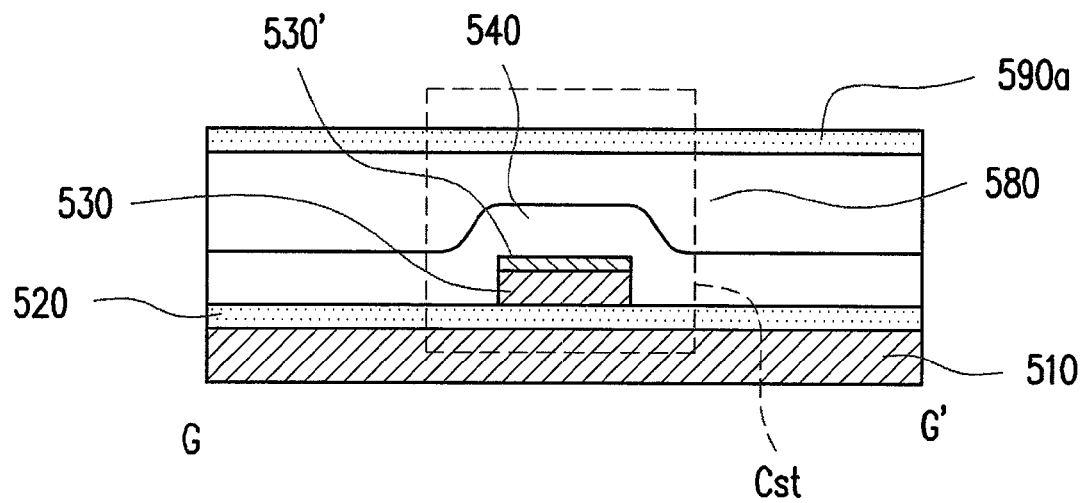
FIG. 7C is the sectional diagram of FIG. 7A along line G-G'.

FIG. 7A is a top view diagram of a TFT array substrate with a-Si TFTs according to an embodiment of the invention. FIG. 7B is the sectional diagram of FIG. 7A along line F-F'. FIG. 7C is the sectional diagram of FIG. 7A along line G-G'. FIG.

7D is the sectional diagram of FIG. 7A along line H-H'. Referring to FIGS. 7A-7D, the TFT array substrate 500 includes a substrate 510, a first patterned transparent conductive layer 520, a first metal layer 530, a first insulating layer 540, a channel layer 550, a second patterned transparent conductive layer 560, a second metal layer 570, a second insulating layer 580 and a third patterned transparent conductive layer 590.

Referring to FIGS. 7A-7D, the substrate 510 has a pixel region 512 and a bonding pad region 514 located surrounding the pixel region 512 and the substrate 510 may be a glass substrate or a quartz substrate. The first patterned transparent conductive layer 520 is disposed on the substrate 510 and the material of the first patterned transparent conductive layer 520 may be silicon oxide, silicon nitride, silicon nitride oxide or other similar materials.

Especially, the first metal layer 530 is partially disposed on the first patterned transparent conductive layer 520, and the first metal layer 530 includes a gate 532, a scan line 534 electrically connected to the gate 532 and a common line 536 located within the pixel region 512. Particularly, a part of the first patterned transparent conductive layer 520 is disposed under the common line 536. The material of the first metal layer 530 is, for example, Cr, Mo, AlNd/AlNdN, Mo/Al/Mo.

The first insulating layer 540 covers the first metal layer 530 (as shown in FIGS. 7B and 7C). The material of the first insulating layer 540 is, for example, silicon oxide, silicon nitride, silicon nitride oxide or other similar materials. The channel layer 550 is disposed on the first insulating layer 540 over the gate 532 and is made of, for example, a-Si.

The second patterned transparent conductive layer 560 is disposed on the substrate 510. Particularly, the second metal layer 570 is partially disposed on the second patterned transparent conductive layer 560, and the second metal layer 570 includes a source 572 and a drain 574 respectively disposed at two sides of the channel layer 550, and a data line 576 electrically connected to the source 572. A part of the second patterned transparent conductive layer 560 is disposed under the drain 574.

Figure 7D:
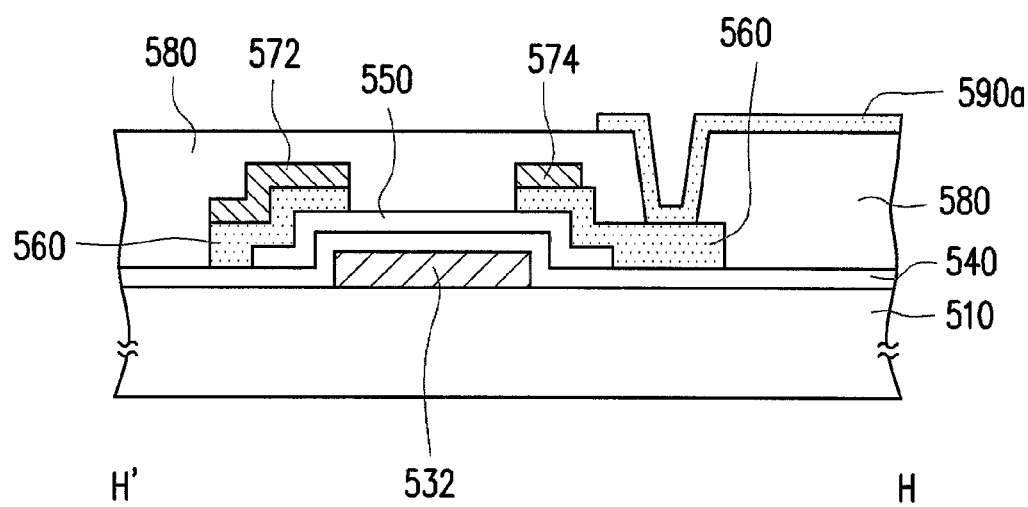
FIG. 7D is the sectional diagram of FIG. 7A along line H-H'.

The second insulating layer 580 covers the second metal layer 570 and exposes the second patterned transparent conductive layer 560 under the drain 574. Note that, as shown by FIGS. 7A and 7D, the drain 574 is partially located on the second patterned transparent conductive layer 560, and the drain 574 doesn't extend into the pixel region 512. Instead, the second patterned transparent conductive layer 560 is extended into the pixel region 512 and is contact with the drain 574.

The third patterned transparent conductive layer 590 is disposed on the second insulating layer 580 and the third patterned transparent conductive layer 590 includes a pixel electrode 590a located within the pixel region 512. The pixel electrode 590a is electrically connected to the second patterned transparent conductive layer 560 under the drain 574. Especially, since the pixel electrode 590a and the second patterned transparent conductive layer 560 are made of the same material, the contact resistance is reduced, which facilitates to deliver electronic signals.

Figure 2A:
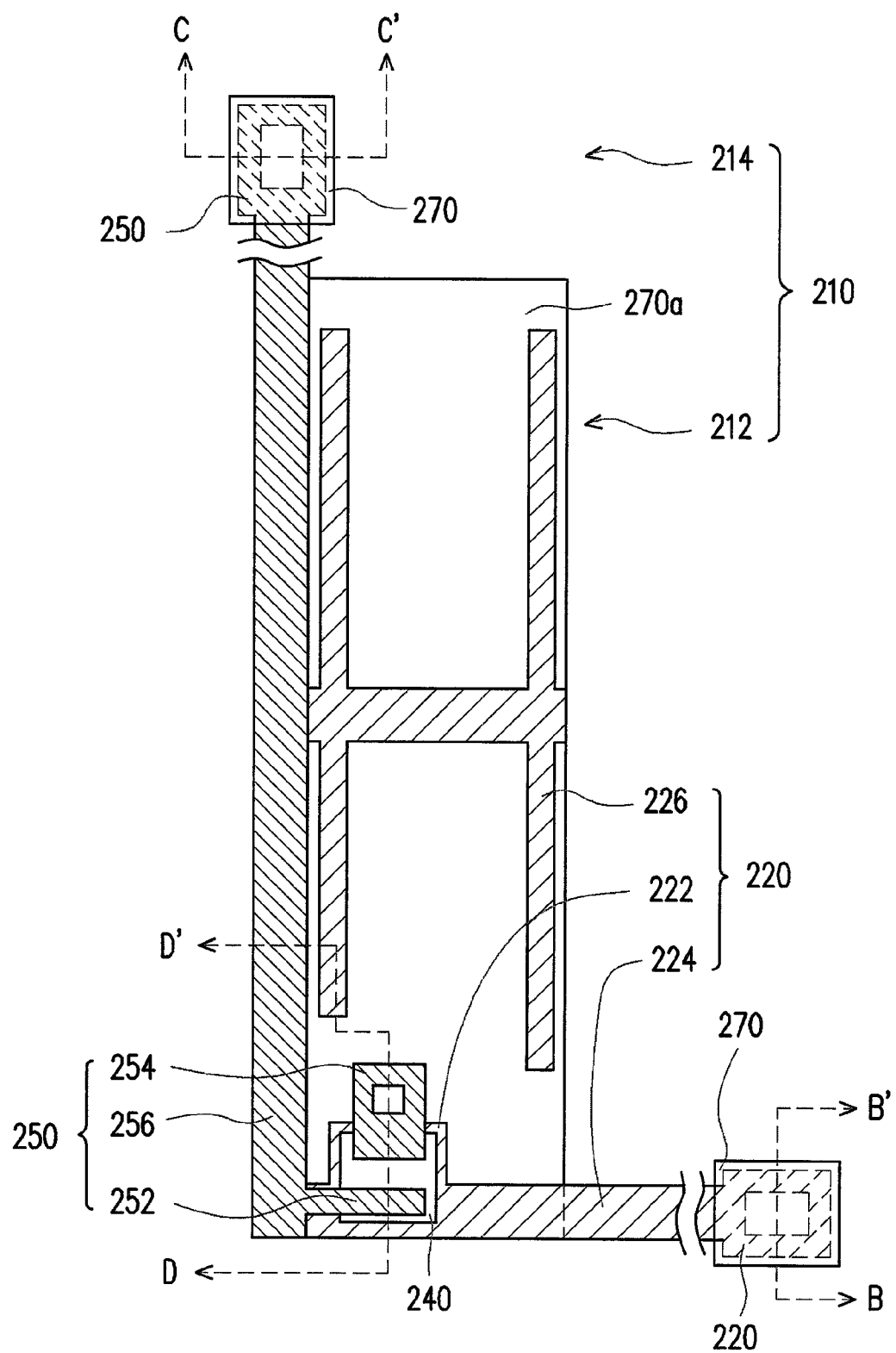
FIG. 2A is a top view diagram of a conventional TFT array substrate with amorphous silicon thin film transistors (a-Si TFTs).
Figure 2B:
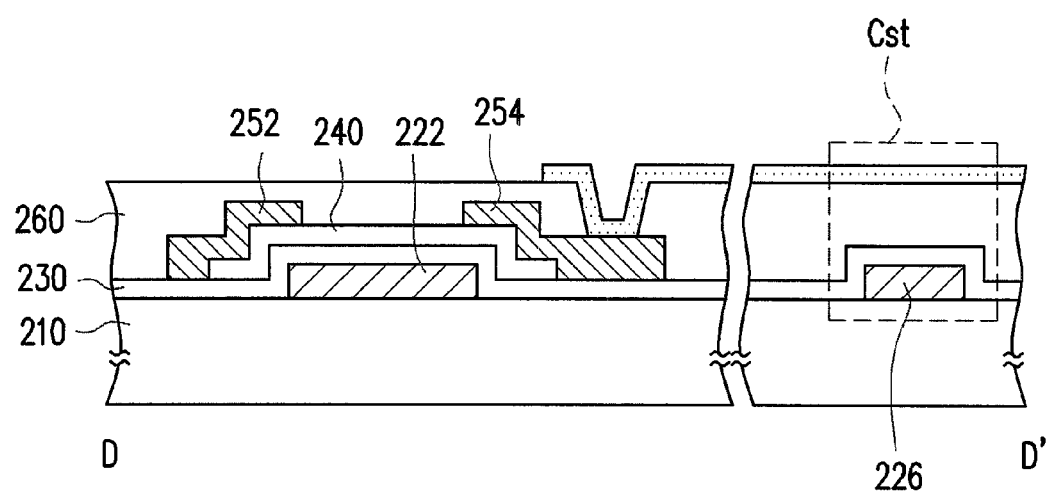
FIG. 2B is the sectional diagram of FIG. 2A along line D-D'.
Figure 2C:
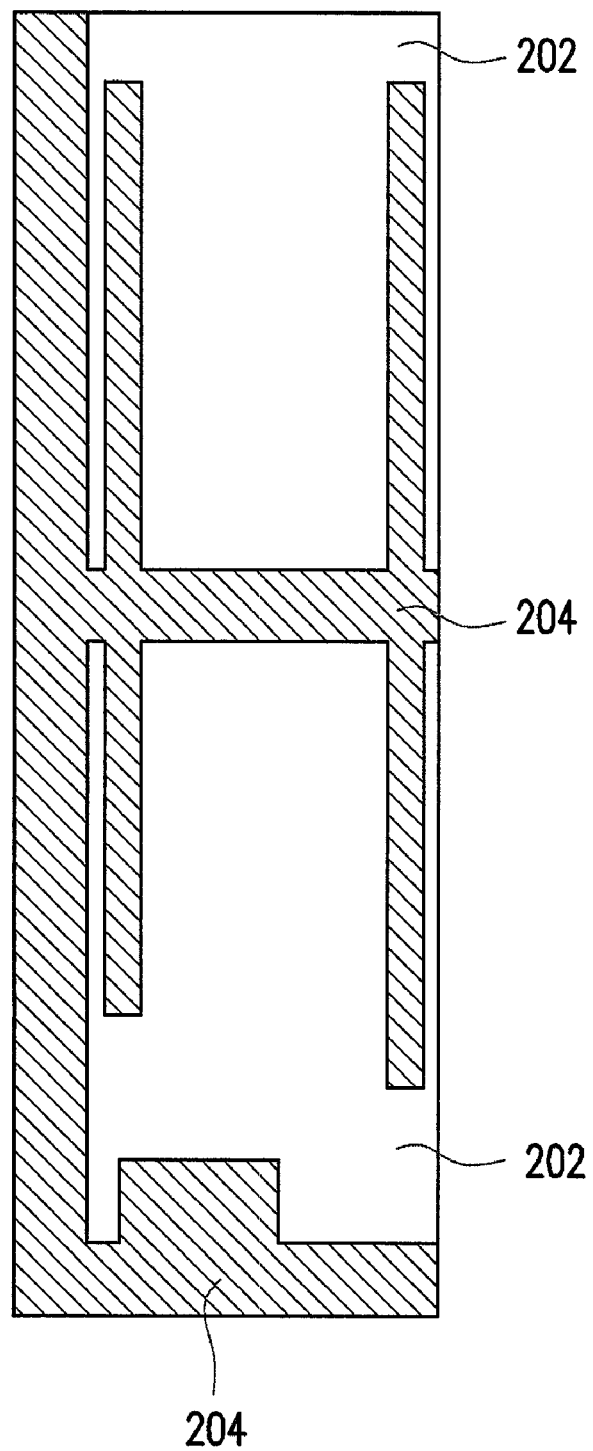
FIG. 2C is a diagram showing a transparent region and an opaque region of the TFT array substrate of FIG. 2A.
Figure 3A:
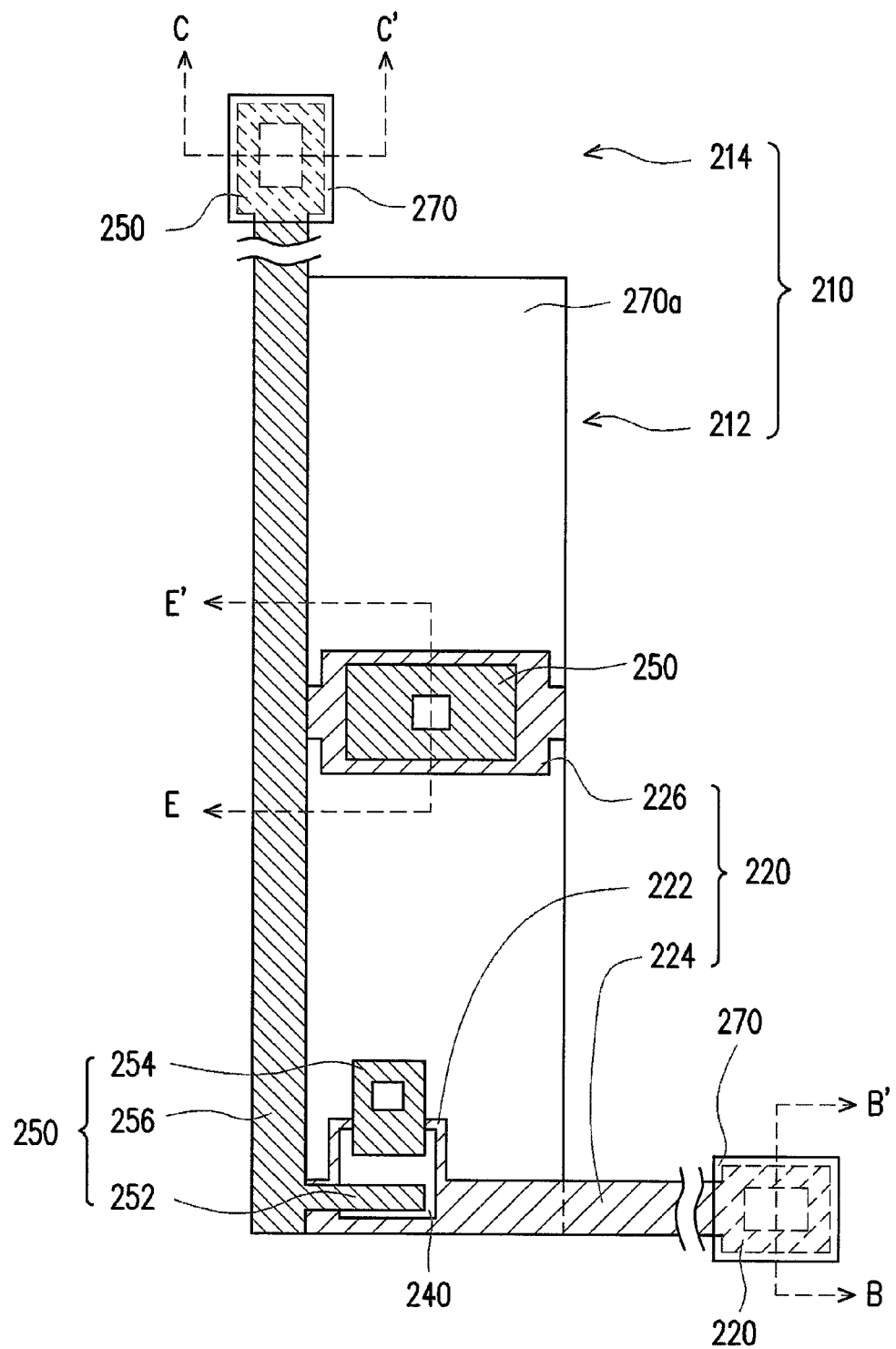
FIG. 3A is a top view diagram of another conventional TFT array substrate with amorphous silicon thin film transistors (a-Si TFTs).
Figure 3B:
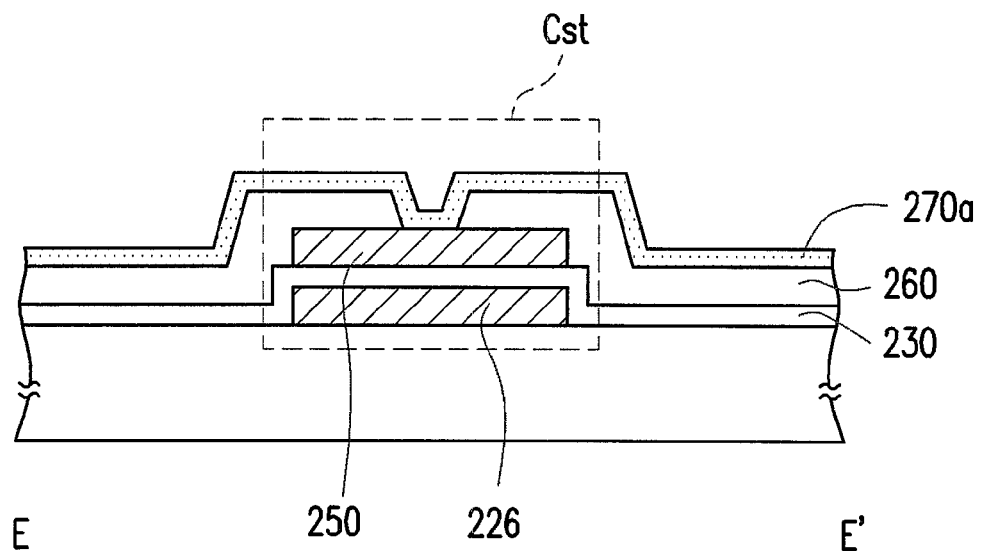
FIG. 3B is the sectional diagram of FIG. 3A along line E-E'.
Figure 4A:
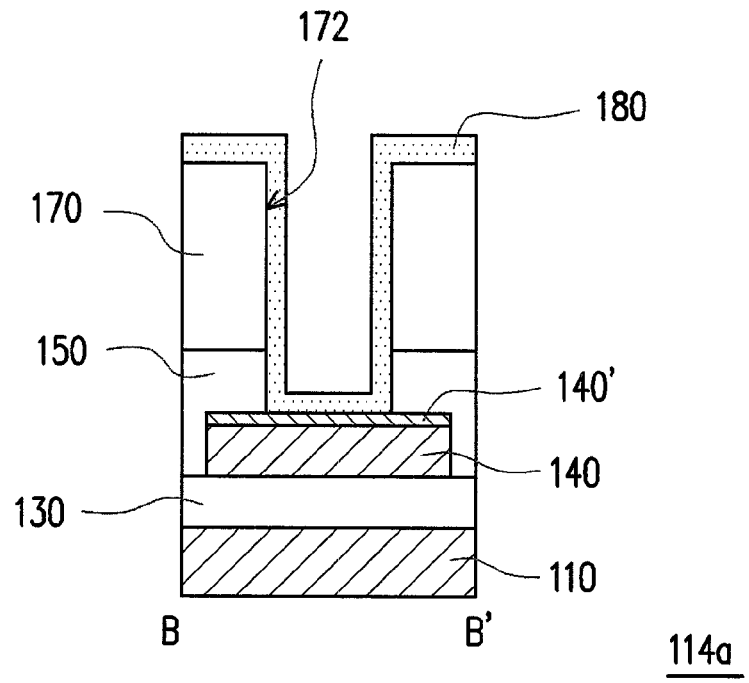
FIG. 4A is the sectional diagram of FIG. 1A along line B-B'.
Figure 4B:
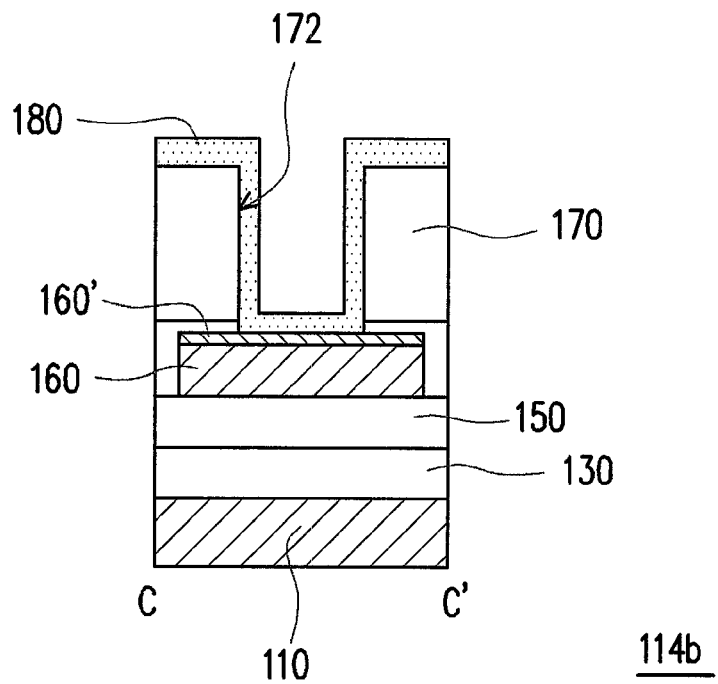
FIG. 4B is the sectional diagram of FIG. 1A along line C-C'.

To sum up, in the TFT array substrate 500 in FIGS. 7A-7D, the first patterned transparent conductive layer 520 is disposed under the first metal layer 530, and the only opaque area within the pixel region 512 is the area existed with the common line 536 which is made of metal for providing capacitor's voltages; in other words, the embodiment uses the first patterned transparent conductive layer 520 and a part of the common line 536 located over the first patterned transparent conductive layer 520 to substitute the common electrode 226 with a large area (as shown in FIG. 2A) in the prior art. Therefore, the present embodiment can increase the aperture ratio, obtain large storage capacitance and reduce the contact resistance.

Moreover, the embodiment makes the drain 574 partially disposed on the channel layer 550 and the second patterned transparent conductive layer 560 extending into the pixel region 512 (as shown in FIG. 7A) so as to further promote the aperture ratio of the TFT array substrate 500.

Referring to FIGS. 7A and 7C, the common line 536 and the first patterned transparent conductive layer 520 together serve as the lower electrode of the storage capacitor Cst and the pixel electrode 590a serves as the upper electrode of the storage capacitor Cst.

Figure 7E:
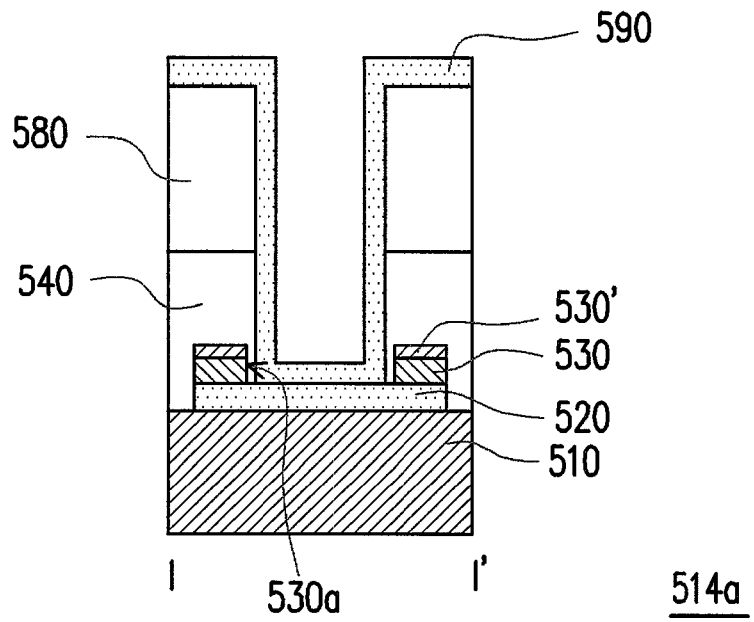
FIG. 7E is the sectional diagram of FIG. 7A along line I-I'.

FIG. 7E is the sectional diagram of FIG. 7A along line I-I'. Referring to FIGS. 7A and 7E, the TFT array substrate 500 may further includes a scan bonding pad 514a, which is disposed within the bonding pad region 514 and electrically connected to the scan line 534. The scan bonding pad 514a includes the first patterned transparent conductive layer 520, the first metal layer 530 and the third patterned transparent conductive layer 590. The first metal layer 530 is disposed on the first patterned transparent conductive layer 520, and the first metal layer 530 has a contact hole 530a. The third patterned transparent conductive layer 590 is electrically connected to the first patterned transparent conductive layer 520 via the contact hole 530a.

Figure 7F:
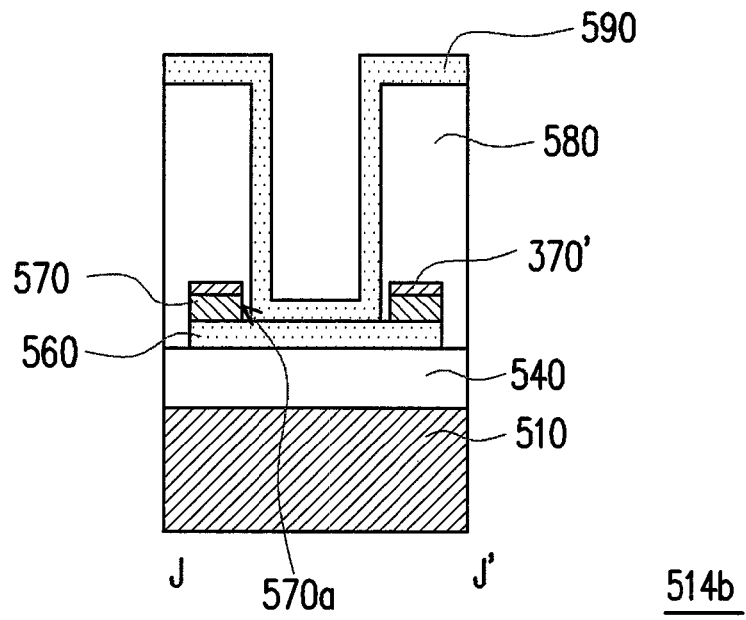
FIG. 7F is the sectional diagram of FIG. 7A along line J-J'.

FIG. 7F is the sectional diagram of FIG. 7A along line J-J'. Referring to FIGS. 7A and 7F, the TFT array substrate 500 may further includes a data bonding pad 514b, which is disposed within the bonding pad region 514 and electrically connected to the data line 576. The data bonding pad 514b includes the second patterned transparent conductive layer 560, the second metal layer 570 and the third patterned transparent conductive layer 590. The second metal layer 570 is disposed on the second patterned transparent conductive layer 560 and has a contact hole 570a. The third patterned transparent conductive layer 590 is electrically connected to the second patterned transparent conductive layer 560 via contact hole 570a.

Note that, the first metal layer 530 of the scan bonding pad 514a has a contact hole 530a. Thus, the third patterned transparent conductive layer 590 can contact the first patterned transparent conductive layer 520 under the first metal layer 530 via the contact hole 530a. Because the third patterned transparent conductive layer 590 and the first patterned transparent conductive layer 520 utilize the same material, the contact resistance at the interface between them is almost zero.

Especially, the third patterned transparent conductive layer 590 does not directly contact a nitriding metal film layer 530' over the first metal layer 530. Therefore, the contact resistance can be reduced substantially. The data bonding pad 514b shown in FIG. 7F is designed in the same way so as to facilitate delivering electronic signals.

The Second Embodiment

Figure 8A:
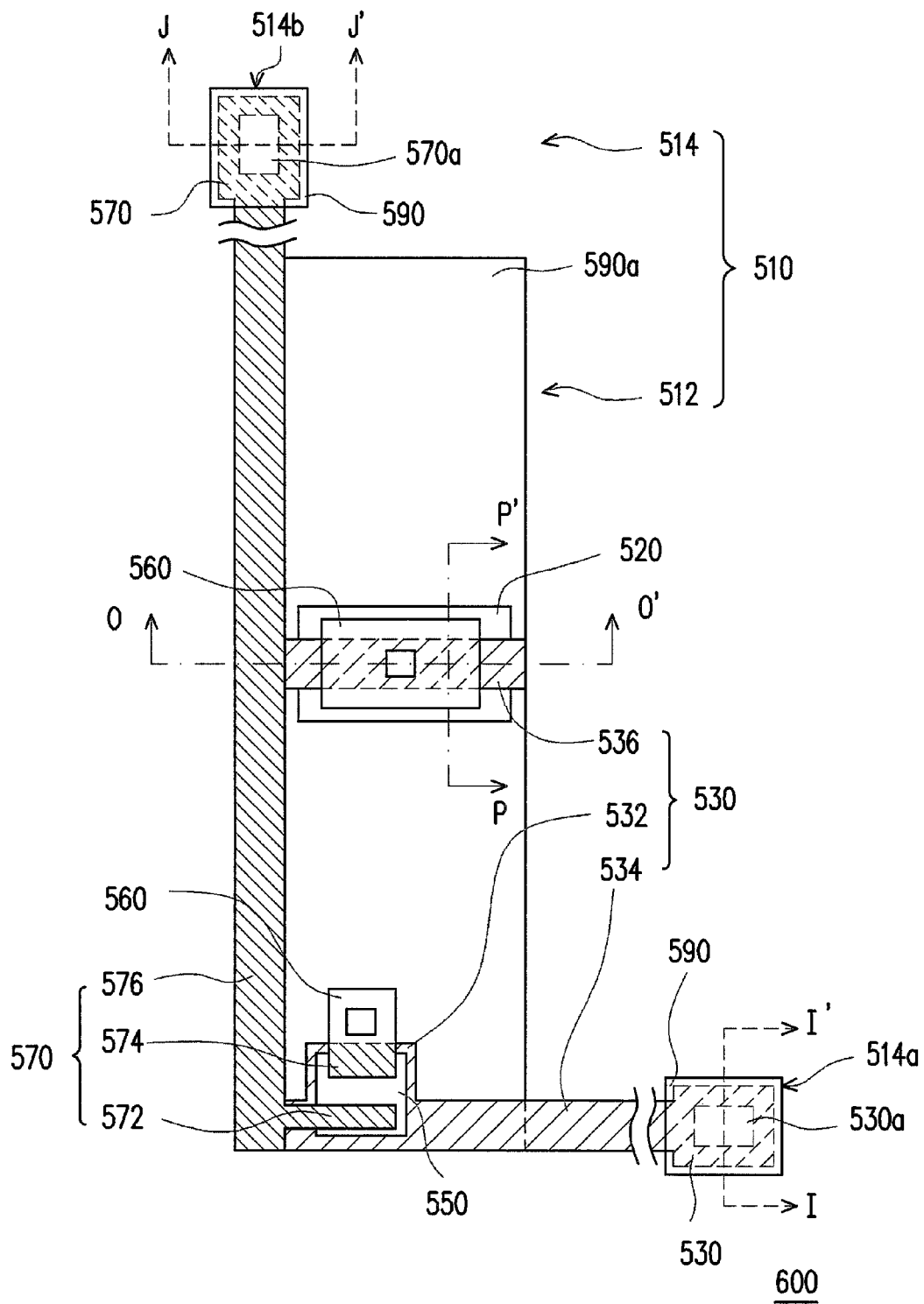
FIG. 8A is a top view diagram of a TFT array substrate with a-Si TFTs according to another embodiment of the invention.
Figure 8B:
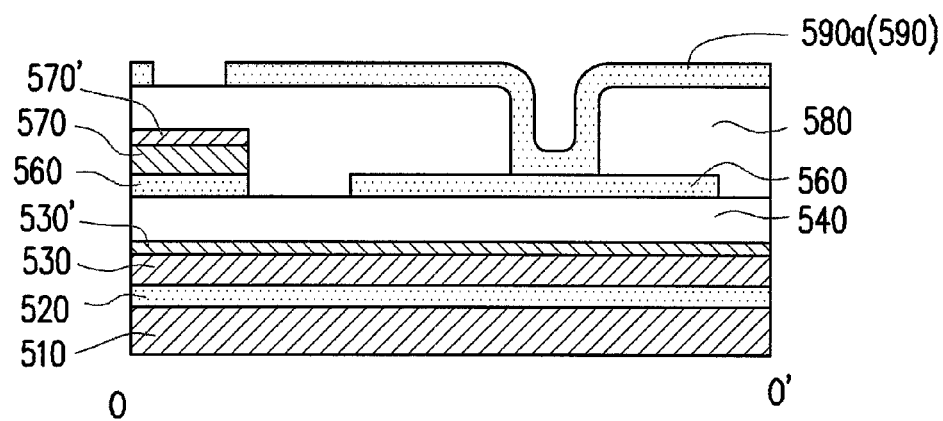
FIG. 8B is the sectional diagram of FIG. 8A along line O-O'.
Figure 8C:
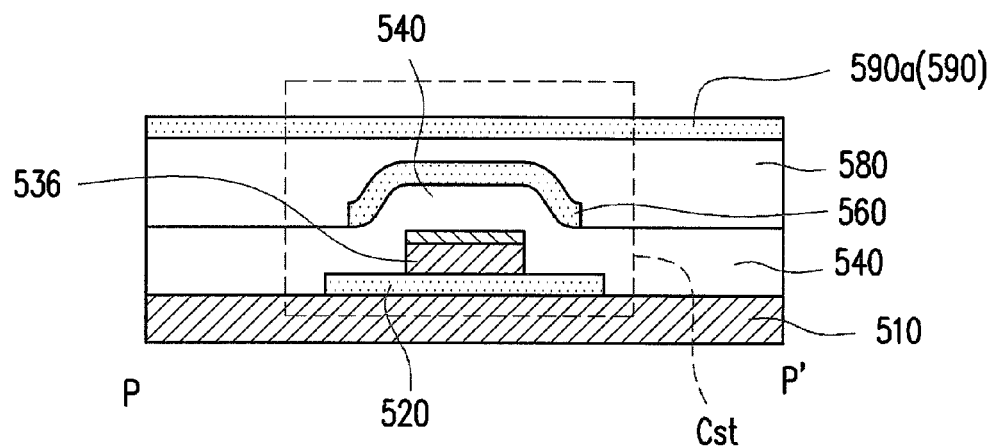
FIG. 8C is the sectional diagram of FIG. 8A along line P-P'.

FIG. 8A is a top view diagram of a TFT array substrate with a-Si TFTs according to another embodiment of the invention. FIG. 8B is the sectional diagram of FIG. 8A along line O-O'. FIG. 8C is the sectional diagram of FIG. 8A along line P-P'.

The TFT array substrate 600 has the structure similar to the TFT array substrate 500 shown in FIGS. 7A-7D and the same components are represented with the same marks. In addition, the materials and the dispositions of the film layers of TFT array substrate 600 are similar to that in FIGS. 7A-7D as well and detail description is omitted.

Note that, in the TFT array substrate 600 of the embodiment, as shown in FIGS. 8A-8C, the first patterned transparent conductive layer 520 is disposed under the common line 536, and the second patterned transparent conductive layer 560 and the pixel electrode 590a are disposed over the common line 536, and the pixel electrode 590a is electrically connected to the second patterned transparent conductive layer 560.

In particular, the above-mentioned common line 536 and first patterned transparent conductive layer 520 serve as the lower electrode of the storage capacitor Cst, and the second patterned transparent conductive layer 560 and the pixel electrode 590a, both located over the common line 536 and the first patterned transparent conductive layer 520, serve as the upper electrode of the storage capacitor Cst. In this way, a bilayer capacitor structure with larger storage capacitance is formed, which facilitates to promote the display quality. The scan bonding pad 514a and the data bonding pad 514b of the TFT array substrate 600 as shown by FIG. 8A has the similar design to that in FIGS. 7E and 7F, and the design is omitted to describe.

The Fabricating Method of a TFT Array Substrate with a-Si TFTs

The First Embodiment

Referring to FIGS. 7A-7C, the fabricating method of the TFT array substrate 500 includes following steps. First, a substrate 510 is provided, and the substrate 510 has a pixel region 512 and a bonding pad region 514 located surrounding the pixel region 512. The substrate 510 can be a glass substrate or a quartz substrate.

Next, a first patterned transparent conductive layer 520 is formed on the substrate 510 by using, for example, sputtering. The material of the first patterned transparent conductive layer 520 is, for example, ITO, IZO or other similar materials.

Then, a first metal layer 530 is formed on a part of the first patterned transparent conductive layer 520, and the first metal layer 530 includes a gate 532, a scan line 534 electrically connected to the gate 532 and a common line 536 disposed within the pixel region 512. A part of the first patterned transparent conductive layer 520 is disposed under the common line 536. The method of forming the first metal layer 530 is, for example, sputtering, and the material of the first metal layer 530 is, for example, Cr, Mo, AlNd/AlNdN, Mo/Al/Mo.

Note that, when fabricates the common line 536 of FIGS. 7A-7C and the first patterned transparent conductive layer 520 which also serves as the common electrode located under the common line 536, two photomasks are usually utilized. For saving the photomasks and simultaneously fabricating the common line 536 shown in FIGS. 7A-7C and the first patterned transparent conductive layer 520 under the common line 536, in another embodiment of the invention, a half-tone photomask or a gray-tone photomask instead of the above-mentioned two photomasks is used to form the above-mentioned structures in association with a lithography-etching process.

After that, a first insulating layer 540 is formed to cover the first metal layer 530. The first insulating layer 540 is formed by using, for example, CVD process, and the material of the first insulating layer 540 is, for example, silicon oxide, silicon nitride, silicon nitride oxide or other similar materials.

Further, a channel layer 550 is formed on the first insulating layer 540 over the gate 532, and the channel layer 550 is made of, for example, a-Si.

Further, a second patterned insulating layer 560 is formed on the substrate 510, and the material of the second patterned transparent conductive layer 560 is, for example, can be ITO, IZO or other similar materials.

And then, a second metal layer 570 is formed on a part of the second patterned transparent conductive layer 560. The second metal layer 570 includes a source 572 and a drain 574 disposed at two sides of the channel layer 550, and a data line 576 electrically connected to the source 572. A part of the second patterned transparent conductive layer 560 herein is disposed under the drain 574. Note that, the second patterned transparent conductive layer 560 extends into the pixel region 512, and the drain 574 is located on the channel layer 550 as shown in FIG. 7D.

After that, a second insulating layer 580 is formed to cover the second metal layer 570 and expose the second patterned transparent conductive layer 560 under the drain 574.

Further, a third patterned transparent conductive layer 590 is formed on the substrate 510, and the third patterned transparent conductive layer 590 includes the pixel electrode 590a electrically connected to the second patterned transparent conductive layer 560 under the drain 574, as shown by FIG. 7D.

Moreover, the above-mentioned fabricating method of the TFT array substrate 500 as shown in FIG. 7E may further includes forming the scan bonding pad 514a within the bonding pad region 514, and the scan bonding pad 514a is electrically connected to the scan line 534. The method of forming the scan bonding pad 514a includes following steps. The first patterned transparent conductive layer 520 is formed within the bonding pad region 514. The first metal layer 530 is formed on the first patterned transparent conductive layer 520, and the first metal layer 530 has a contact hole 530a. Then, a third patterned transparent conductive layer 590 is formed on the first metal layer 530, and the third patterned transparent conductive layer 590 is electrically connected to the first patterned transparent conductive layer 520 via the contact hole 530a.

The fabricating method of the above-mentioned TFT array substrate 500 further includes forming the data bonding pad 514b within the bonding pad region 514 as shown in FIG. 7F, and the data bonding pad 514b is electrically connected to the data line 576. The method of forming the data bonding pad 514b includes following steps. The second patterned transparent conductive layer 560 is formed within the bonding pad region 514. The second metal layer 570 is formed on the second patterned transparent conductive layer 560, wherein the second metal layer 570 has a contact hole 570a. Then, a third patterned transparent conductive layer 590 is formed on the second metal layer 570, wherein the third patterned transparent conductive layer 590 is electrically connected to the second patterned transparent conductive layer 560 via the contact hole 570a.

The above-mentioned fabricating method of the TFT array substrate 500 is suitable to fabricate a TFT array substrate with large storage capacitance and increased aperture ratio. In addition, the photomasks are saved in the present embodiment by using the half-tone photomask or the gray-tone photomask. The scan bonding pad 514a and the data bonding pad 514b in the TFT array substrate 500 have low contact resistance, which facilitates to delivery electronic signals.

The Second Embodiment

Referring to FIGS. 8A-8C, the fabricating method of the TFT array substrate 600 in the embodiment is similar to that of the TFT array substrate 500, and the same components are represented by the same marks.

Especially, in the TFT array substrate 600, a first patterned transparent conductive layer 520 is formed under the common line 536, and the second patterned transparent conductive layer 560 and the pixel electrode 590a are formed over the common line 536. The pixel electrode 590a is electrically connected to the second patterned transparent conductive layer 560 so as to obtain better storage capacitance.

As shown in FIG. 8C, usually two photomasks are needed to form the first metal layer 530 and the first patterned transparent conductive layer 520 under the first metal layer 530; but for saving the photomasks, the embodiment uses a half-tone photomask or a gray-tone photomask in association with a conducts lithography-etching process to form the structure shown by FIG. 8C.

In the embodiment, the scan bonding pad 514a and the data bonding pad 514b have the same designs as the first embodiment for reducing the contact resistance, which is omitted to describe.

In summary, the TFT array substrate and the fabricating method thereof of the invention have the advantages as follows:

(1) The patterned transparent conductive layers are disposed under the first metal layer and/or the second metal layer so as to substitute the most areas of the first metal layer and/or the second metal layer in the prior art, which is able to increase the aperture ratio and obtain large storage capacitance.

(2) The scan bonding pad and the data bonding pad of the TFT array substrate have low contact resistance, which facilitates delivering electronic signals.

(3) The patterned transparent conductive layers are disposed under the first metal layer and/or the second metal layer, and fabricated by using a half-tone photomask or a gray-tone photomask, which can save the number of the photomasks.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A fabricating method of a thin film transistor array substrate, comprising:
    providing a substrate, wherein the substrate has a pixel region and a bonding pad region located surrounding the pixel region;
    forming a patterned polysilicon layer within the pixel region on the substrate, wherein the patterned polysilicon layer comprises a source and a drain;
    forming a first patterned insulating layer to cover the patterned polysilicon layer;
    forming a first patterned transparent conductive layer on the first patterned insulating layer;
    forming a first metal layer on the first patterned transparent conductive layer, wherein the first metal layer is partially disposed on the first patterned transparent conductive layer and comprises a gate, a scan line electrically connected to the gate and a common line disposed within the pixel region, and a part of the first patterned transparent conductive layer is disposed under the common line;
    forming a second patterned insulating layer to cover the first metal layer, wherein the first patterned insulating layer and the second patterned insulating layer have a first contact hole to expose the drain;
    forming a second patterned transparent conductive layer on the second patterned insulating layer, wherein a part of the second patterned transparent conductive layer is electrically connected to the drain via the first contact hole;
    forming a second metal layer on the second patterned transparent conductive layer, wherein the second metal layer is partially disposed on the second patterned transparent conductive layer and the second metal layer comprises a data line electrically connected to the source, and a part of the second patterned transparent conductive layer is disposed under the data line;
    forming a third patterned insulating layer to cover the second metal layer, wherein the third patterned insulating layer has a second contact hole to expose the second patterned transparent conductive layer electrically connected to the drain; and
    forming a third patterned transparent conductive layer on the third patterned insulating layer, wherein the third patterned transparent conductive layer comprises a pixel electrode located within the pixel region, and the pixel electrode is electrically connected to the second patterned transparent conductive layer via the second contact hole.

2. The fabricating method of a thin film transistor array substrate according to claim 1, further comprising forming a scan bonding pad within the bonding pad region, wherein the scan bonding pad is electrically connected to the scan line, and the method of forming the scan bonding pad comprises:
    forming the first patterned transparent conductive layer within the bonding pad region;
    forming the first metal layer on the first patterned transparent conductive layer, wherein the first metal layer has a contact hole; and
    forming the third patterned transparent conductive layer on the first metal layer, wherein the third patterned transparent conductive layer is electrically connected to the first patterned transparent conductive layer via the contact hole.

3. The fabricating method of a thin film transistor array substrate according to claim 1, further comprising forming a data bonding pad within the bonding pad region, wherein the data bonding pad is electrically connected to the data line, and the method of forming the data bonding pad comprises:
    forming the second patterned transparent conductive layer within the bonding pad region;
    forming the second metal layer on the second patterned transparent conductive layer, wherein the second metal layer has a contact hole; and
    forming the third patterned transparent conductive layer on the second metal layer, wherein the third patterned transparent conductive layer is electrically connected to the second patterned transparent conductive layer via the contact hole.

4. The fabricating method of a thin film transistor array substrate according to claim 1, further comprising forming the second metal layer on the second patterned transparent conductive layer over the common line, wherein the pixel structure is electrically connected to the second metal layer via the second contact hole.

5. The fabricating method of a thin film transistor array substrate according to claim 1, wherein the method of forming the common line and first patterned transparent conductive layer comprises:

forming a first transparent conductive material layer on the substrate;

forming a first metal material layer on the first transparent conductive material layer; and taking a half-tone photomask as a mask to conduct a lithography-etching process on the first metal material layer and the first transparent conductive material layer so as to form the common line and the first patterned transparent conductive layer.

6. A fabricating method of a thin film transistor array substrate, comprising:

providing a substrate, wherein the substrate has a pixel region and a bonding pad region located surrounding the pixel region;

forming a first patterned transparent conductive layer on the substrate;

forming a first metal layer on a part of the first patterned transparent conductive layer, wherein the first metal layer comprises a gate, a scan line electrically connected to the gate and a common line within the pixel region, and a part of the first patterned transparent conductive layer is disposed under the common line;

forming a first insulating layer to cover the first metal layer;

forming a channel layer on the first insulating layer over the gate;

forming a second patterned transparent conductive layer on the substrate;

forming a second metal layer on a part of the second patterned transparent conductive layer, wherein the second metal layer comprises a source and a drain respectively disposed at two sides of the channel layer and a data line electrically connected to the source, wherein a part of the second patterned transparent conductive layer is disposed under the drain;

forming a second insulating layer to cover the second metal layer and expose the second patterned transparent conductive layer under the drain; and forming a third patterned transparent conductive layer on the substrate, wherein the third patterned transparent conductive layer comprises a pixel electrode electrically connected to the second patterned transparent conductive layer under the drain.

7. The fabricating method of a thin film transistor array substrate according to claim 6, wherein the method of forming the common line and the first patterned transparent conductive layer together serving as the lower electrode of a storage capacitor comprises:

forming a first transparent conductive material layer on the substrate;

forming a first metal material layer on the first transparent conductive material layer; and taking a half-tone photomask as a mask to conduct a lithography-etching process on the first metal material layer and the first transparent conductive material layer so as to form the common line and the first patterned transparent conductive layer.

8. The fabricating method of a thin film transistor array substrate according to claim 6, further comprising forming a scan bonding pad within the bonding pad region, wherein the scan bonding pad is electrically connected to the scan line, and the method of forming the scan bonding pad comprises:

forming the first patterned transparent conductive layer within the bonding pad region;

forming the first metal layer on the first patterned transparent conductive layer, wherein the first metal layer has a contact hole; and forming the third patterned transparent conductive layer on the first metal layer, wherein the third patterned transparent conductive layer is electrically connected to the first patterned transparent conductive layer via the contact hole.

9. The fabricating method of a thin film transistor array substrate according to claim 6, further comprising forming a data bonding pad within the bonding pad region, wherein the data bonding pad is electrically connected to the data line, and the method of forming the data bonding pad comprises:

forming the second patterned transparent conductive layer within the bonding pad region;

forming the second metal layer on the second patterned transparent conductive layer, wherein the second metal layer has a contact hole; and forming the third patterned transparent conductive layer on the second metal layer, wherein the third patterned transparent conductive layer is electrically connected to the second patterned transparent conductive layer via the contact hole.

* * * * *